US007658163B2

(12) United States Patent
Renn et al.

(10) Patent No.: US 7,658,163 B2

(45) Date of Patent: *Feb. 9, 2010

(54) DIRECT WRITE# SYSTEM

(75) Inventors: Michael J. Renn, Hudson, WI (US); Bruce H. King, Albuquerque, NM (US); Manampathy G. Giridharan, Mason, OH (US); Jyh-Cherng Sheu, Hsinchu (TW)

(73) Assignee: Optomec Design Company, Albuquerque, NM (US)

( * ) Notice: Subject to any disclaimer, the term of this patent is extended or adjusted under 35 U.S.C. 154(b) by 13 days.

This patent is subject to a terminal disclaimer.

(21) Appl. No.: 11/458,966

(22) Filed: Jul. 20, 2006

(65) Prior Publication Data

US 2007/0181060 A1 Aug. 9, 2007

Related U.S. Application Data

(63) Continuation of application No. 10/072,605, filed on Feb. 5, 2002, now Pat. No. 7,108,894, which is a continuation-in-part of application No. 10/060,960, filed on Jan. 30, 2002, now abandoned, which is a continuation-in-part of application No. 09/584,997, filed on Jun. 1, 2000, now Pat. No. 6,636,676, which is a continuation-in-part of application No. 09/408,621, filed on Sep. 30, 1999, now abandoned.

(60) Provisional application No. 60/102,418, filed on Sep. 30, 1998.

(51) Int. Cl.

| | |
|---|---|
| ***B05C 19/00*** | (2006.01) |
| ***B05B 5/03*** | (2006.01) |
| ***B05B 1/28*** | (2006.01) |
| ***B05B 5/00*** | (2006.01) |

(52) U.S. Cl. ....................... 118/308; 118/621; 118/641; 118/300; 118/62; 239/296

(58) Field of Classification Search ................. 118/308, 118/309, 300, 621, 641, 59, 62; 427/596, 427/446, 455, 591, 180; 385/125, 11, 147; 436/173; 239/296, 419.3, 419.5, 422, 427, 239/427.3, 427.5, 601, 708, 290, 573; 50/251, 50/288; 257/E21.512

See application file for complete search history.

(56) References Cited

U.S. PATENT DOCUMENTS 3,590,477 A 7/1971 Cheroff et al.

(Continued)

FOREIGN PATENT DOCUMENTS

EP 0 331 022 A2 9/1989

(Continued)

OTHER PUBLICATIONS et al., *Webster's Ninth New Collegiate Dictionary* Merriam-Webster, Inc., Springifled, MA. USA 1990 , 744.

(Continued)

*Primary Examiner*—Yewebdar T Tadesse

(74) *Attorney, Agent, or Firm*—Philip D. Askenazy; Jeffrey D. Myers; Peacock Myers, P.C.

(57) ABSTRACT

Methods and apparatus for the deposition of a source material (10) are disclosed. An atomizer (12) renders a supply of source material (10) into many discrete particles. A force applicator (14) propels the particles in continuous, parallel streams of discrete particles. A collimator (16) controls the direction of flight of the particles in the stream prior to their deposition on a substrate (18). In an alternative embodiment of the invention, the viscosity of the particles may be controlled to enable complex depositions of non-conformal or three-dimensional surfaces. The invention also includes a wide variety of substrate treatments which may occur before, during or after deposition. In yet another embodiment of the invention, a virtual or cascade impactor may be employed to remove selected particles from the deposition stream.

18 Claims, 17 Drawing Sheets

U.S. PATENT DOCUMENTS

| | | | | |
|---|---|---|---|---|
| 3,715,785 | A | 2/1973 | Brown et al. | |
| 3,808,432 | A | 4/1974 | Ashkin | |
| 3,808,550 | A | 4/1974 | Ashkin | |
| 3,846,661 | A | 11/1974 | Brown et al. | |
| 3,854,321 | A | 12/1974 | Dahneke | |
| 3,901,798 | A | 8/1975 | Peterson | |
| 3,959,798 | A | 5/1976 | Hochberg et al. | |
| 3,974,769 | A | 8/1976 | Hochberg et al. | |
| 3,982,251 | A | 9/1976 | Hochberg | |
| 4,016,417 | A | 4/1977 | Benton | |
| 4,019,188 | A | 4/1977 | Hochberg et al. | |
| 4,034,025 | A | 7/1977 | Martner | |
| 4,046,073 | A | 9/1977 | Mitchell et al. | |
| 4,046,074 | A | 9/1977 | Hochberg et al. | |
| 4,092,535 | A | 5/1978 | Ashkin et al. | |
| 4,112,437 | A | 9/1978 | Mir et al. | |
| 4,132,894 | A | 1/1979 | Yule | |
| 4,171,096 | A | 10/1979 | Welsh et al. | |
| 4,200,660 | A | 4/1980 | Schaefer et al. | |
| 4,228,440 | A | 10/1980 | Horike et al. | |
| 4,269,868 | A | 5/1981 | Livsey | |
| 4,323,756 | A | 4/1982 | Brown et al. | |
| 4,453,803 | A | 6/1984 | Hidaka et al. | |
| 4,485,387 | A | 11/1984 | Drumheller | |
| 4,497,692 | A | 2/1985 | Gelchinski et al. | |
| 4,601,921 | A | 7/1986 | Lee | |
| 4,670,135 | A | 6/1987 | Marple et al. | |
| 4,689,052 | A | 8/1987 | Ogren et al. | |
| 4,825,299 | A | 4/1989 | Okada et al. | |
| 4,826,583 | A | 5/1989 | Biernaux et al. | |
| 4,893,886 | A | 1/1990 | Ashkin et al. | |
| 4,904,621 | A | 2/1990 | Loewenstein et al. | |
| 4,911,365 | A | 3/1990 | Thiel et al. | |
| 4,920,254 | A | 4/1990 | DeCamp et al. | |
| 4,947,463 | A | 8/1990 | Matsuda et al. | |
| 4,997,809 | A | 3/1991 | Gupta | |
| 5,032,850 | A | 7/1991 | Andeen et al. | |
| 5,043,548 | A | 8/1991 | Whitney et al. | |
| 5,064,685 | A | 11/1991 | Kestenbaum et al. | |
| 5,164,535 | A | 11/1992 | Leasure | |
| 5,170,890 | A | 12/1992 | Wilson et al. | |
| 5,182,430 | A | 1/1993 | Lagain | |
| 5,194,297 | A | 3/1993 | Scheer et al. | |
| 5,208,431 | A | 5/1993 | Uchiyama et al. | |
| 5,245,404 | A | 9/1993 | Jannson et al. | |
| 5,250,383 | A | 10/1993 | Naruse | |
| 5,254,832 | A | 10/1993 | Gartner et al. | |
| 5,270,542 | A | 12/1993 | McMurry et al. | |
| 5,292,418 | A | 3/1994 | Morita et al. | |
| 5,322,221 | A | 6/1994 | Anderson | |
| 5,335,000 | A | 8/1994 | Stevens | |
| 5,344,676 | A * | 9/1994 | Kim et al. | 427/468 |
| 5,366,559 | A | 11/1994 | Periasamy | |
| 5,378,505 | A | 1/1995 | Kubota et al. | |
| 5,378,508 | A | 1/1995 | Castro et al. | |
| 5,403,617 | A | 4/1995 | Haaland | |
| 5,449,536 | A | 9/1995 | Funkhouser | |
| 5,486,676 | A | 1/1996 | Aleshin | |
| 5,495,105 | A | 2/1996 | Nishimura et al. | |
| 5,512,745 | A | 4/1996 | Finer et al. | |
| 5,607,730 | A | 3/1997 | Ranalli | |
| 5,609,921 | A | 3/1997 | Gitzhofer et al. | |
| 5,612,099 | A | 3/1997 | Thaler | |
| 5,614,252 | A | 3/1997 | McMillan et al. | |
| 5,648,127 | A | 7/1997 | Turchan et al. | |
| 5,676,719 | A | 10/1997 | Stavropoulos et al. | |
| 5,733,609 | A | 3/1998 | Wang | |
| 5,736,195 | A | 4/1998 | Haaland | |
| 5,770,272 | A | 6/1998 | Biemann et al. | |
| 5,772,106 | A | 6/1998 | Ayers et al. | |
| 5,814,152 | A | 9/1998 | Thaler | |
| 5,844,192 | A | 12/1998 | Wright et al. | |
| 5,854,311 | A | 12/1998 | Richart | |
| 5,882,722 | A | 3/1999 | Kydd | |
| 5,894,403 | A | 4/1999 | Shah et al. | |
| 5,940,099 | A | 8/1999 | Karlinski | |
| 5,958,268 | A | 9/1999 | Engelsberg et al. | |
| 5,965,212 | A | 10/1999 | Dobson et al. | |
| 5,980,998 | A | 11/1999 | Sharma et al. | |
| 5,993,549 | A | 11/1999 | Kindler et al. | |
| 5,997,956 | A | 12/1999 | Hunt et al. | |
| 6,007,631 | A | 12/1999 | Prentice et al. | |
| 6,015,083 | A | 1/2000 | Hayes et al. | |
| 6,025,037 | A | 2/2000 | Wadman et al. | |
| 6,036,889 | A | 3/2000 | Kydd | |
| 6,110,144 | A | 8/2000 | Choh et al. | |
| 6,116,718 | A | 9/2000 | Peeters et al. | |
| 6,136,442 | A | 10/2000 | Wong | |
| 6,151,435 | A | 11/2000 | Pilloff | |
| 6,159,749 | A | 12/2000 | Liu | |
| 6,182,688 | B1 | 2/2001 | Fabre | |
| 6,197,366 | B1 | 3/2001 | Takamatsu | |
| 6,251,488 | B1 | 6/2001 | Miller et al. | |
| 6,258,733 | B1 | 7/2001 | Solayappan et al. | |
| 6,265,050 | B1 | 7/2001 | Wong et al. | |
| 6,290,342 | B1 | 9/2001 | Vo et al. | |
| 6,291,088 | B1 | 9/2001 | Wong | |
| 6,293,659 | B1 | 9/2001 | Floyd et al. | |
| 6,340,216 | B1 | 1/2002 | Peeters et al. | |
| 6,348,687 | B1 | 2/2002 | Brockmann et al. | |
| 6,349,668 | B1 | 2/2002 | Sun et al. | |
| 6,379,745 | B1 | 4/2002 | Kydd et al. | |
| 6,390,115 | B1 * | 5/2002 | Rohwer et al. | 137/3 |
| 6,406,137 | B1 | 6/2002 | Okazaki et al. | |
| 6,416,156 | B1 | 7/2002 | Noolandi et al. | |
| 6,416,157 | B1 | 7/2002 | Peeters et al. | |
| 6,416,158 | B1 | 7/2002 | Floyd et al. | |
| 6,416,159 | B1 | 7/2002 | Floyd et al. | |
| 6,416,389 | B1 | 7/2002 | Perry et al. | |
| 6,454,384 | B1 | 9/2002 | Peeters et al. | |
| 6,467,862 | B1 | 10/2002 | Peeters et al. | |
| 6,471,327 | B2 | 10/2002 | Jagannathan et al. | |
| 6,481,074 | B1 | 11/2002 | Karlinski | |
| 6,503,831 | B2 | 1/2003 | Speakman | |
| 6,513,736 | B1 | 2/2003 | Skeath et al. | |
| 6,521,297 | B2 | 2/2003 | McDougall et al. | |
| 6,537,501 | B1 | 3/2003 | Holl et al. | |
| 6,544,599 | B1 | 4/2003 | Brown et al. | |
| 6,548,122 | B1 | 4/2003 | Sharma et al. | |
| 6,573,491 | B1 | 6/2003 | Marchitto et al. | |
| 6,607,597 | B2 | 8/2003 | Sun et al. | |
| 6,636,676 | B1 | 10/2003 | Renn | |
| 6,646,253 | B1 | 11/2003 | Rohwer et al. | |
| 6,780,377 | B2 | 8/2004 | Hall et al. | |
| 6,811,805 | B2 | 11/2004 | Gilliard et al. | |
| 6,823,124 | B1 | 11/2004 | Renn et al. | |
| 6,832,124 | B2 | 11/2004 | Renn et al. | |
| 6,890,624 | B1 | 5/2005 | Kambe et al. | |
| 7,045,015 | B2 | 5/2006 | Renn et al. | |
| 7,108,894 | B2 | 9/2006 | Renn | |
| 7,270,844 | B2 | 9/2007 | Renn | |
| 7,294,366 | B2 | 11/2007 | Renn et al. | |
| 7,485,345 | B2 | 2/2009 | Renn et al. | |
| 2001/0046551 | A1 | 11/2001 | Falck et al. | |
| 2002/0012743 | A1 | 1/2002 | Sampath et al. | |
| 2002/0096647 | A1 | 7/2002 | Moors et al. | |
| 2002/0100416 | A1 | 8/2002 | Sun et al. | |
| 2002/0132051 | A1 | 9/2002 | Choy | |
| 2002/0162974 | A1 | 11/2002 | Orsini et al. | |
| 2003/0003241 | A1 | 1/2003 | Suzuki et al. | |
| 2003/0020768 | A1 | 1/2003 | Renn | |
| 2003/0048314 | A1 | 3/2003 | Renn | |
| 2003/0108511 | A1 | 6/2003 | Sawhney | |
| 2003/0108664 | A1 | 6/2003 | Kodas et al. | |

| | | | |
|---|---|---|---|
| 2003/0117691 | A1 | 6/2003 | Bi et al. |
| 2003/0138967 | A1 | 7/2003 | Hall et al. |
| 2003/0175411 | A1 | 9/2003 | Kodas et al. |
| 2003/0180451 | A1 | 9/2003 | Kodas et al. |
| 2003/0202043 | A1 | 10/2003 | Moffat et al. |
| 2003/0219923 | A1 | 11/2003 | Nathan et al. |
| 2004/0029706 | A1 | 2/2004 | Barrera et al. |
| 2004/0038808 | A1 | 2/2004 | Hampden-Smith et al. |
| 2004/0080917 | A1 | 4/2004 | Steddom et al. |
| 2004/0151978 | A1 | 8/2004 | Huang |
| 2004/0179808 | A1 | 9/2004 | Renn |
| 2004/0197493 | A1 | 10/2004 | Renn et al. |
| 2004/0247782 | A1 | 12/2004 | Hampden-Smith et al. |
| 2005/0110064 | A1 | 5/2005 | Duan et al. |
| 2005/0129383 | A1 | 6/2005 | Renn et al. |
| 2005/0145968 | A1 | 7/2005 | Goela et al. |
| 2005/0147749 | A1 | 7/2005 | Liu et al. |
| 2005/0156991 | A1 | 7/2005 | Renn |
| 2005/0163917 | A1 | 7/2005 | Renn |
| 2005/0184328 | A1 | 8/2005 | Uchiyama et al. |
| 2006/0008590 | A1 | 1/2006 | King et al. |
| 2006/0163570 | A1 | 7/2006 | Renn et al. |
| 2006/0175431 | A1 | 8/2006 | Renn et al. |
| 2006/0233953 | A1 | 10/2006 | Renn et al. |
| 2006/0280866 | A1 | 12/2006 | Marquez et al. |
| 2007/0019028 | A1 | 1/2007 | Renn et al. |

FOREIGN PATENT DOCUMENTS

| | | | |
|---|---|---|---|
| EP | 0 444 550 A2 | | 9/1991 |
| EP | 0470911 | | 7/1994 |
| JP | 2007-507114 | | 3/2007 |
| KR | 10-2007-0008614 | | 1/2007 |
| KR | 10-2007-00008621 | | 1/2007 |
| WO | WO 00/23825 | | 4/2000 |
| WO | WO 00/69235 | | 11/2000 |
| WO | WO01/83101 A1 | * | 8/2001 |
| WO | WO 2006/041657 A2 | | 4/2006 |
| WO | WO 2006/065978 A2 | | 6/2006 |

OTHER PUBLICATIONS

Ashkin, A et al., "Acceleration and Trapping of Particles by Radiation Pressure", *Physical Review Letters* Jan. 26, 1970, 156-159.

Ashkin, A. et al., "Optical trapping and manipulation of single cells using infrared laser beams", *Nature* Dec. 1987 , 769-771.

Dykhuizen, R. C. et al., "Impact of High Velocity Cold Spray Particles", May 13, 2000 , 1-18.

Fernandez De La Mora, J. et al., "Aerodynamic focusing of particles in a carrier gas", *J. Fluid Mech.* vol. 195, printed in Great Britain 1988, 1-21.

King, Bruce et al., "M3D TM Technology: Maskless Mesoscale TM Materials Deposition", *Optomec pamphlet* 2001.

Lewandowski, H. J. et al., "Laser Guiding of Microscopic Particles in Hollow Optical Fibers", *Announcer 27, Summer Meeting—Invited and Contributed Abstracts* Jul. 1997 , 89.

Marple, V. A. et al., "Inertial, Gravitational, Centrifugal, and Thermal Collection Techniques", *Aerosol Measurement: Principles, Techniques and Applications* 2001 , 229-260.

Miller, Doyle et al., "Maskless Mesoscale Materials Deposition", *HDI* vol. 4, No. 9 Sep. 2001 , 1-3.

Odde, D. J. et al., "Laser-Based Guidance of Cells Through Hollow Optical Fibers", *The American Society for Cell Biology Thirty-Seventh Annual Meeting* Dec. 17, 1997.

Odde, D. J. et al., "Laser-guided direct writing for applications in biotechnology", *Trends in Biotechnology* Oct. 1999 , 385-389.

Rao, N. P. et al., "Aerodynamic Focusing of Particles in Viscous Jets", *J. Aerosol Sci.* vol. 24, No. 7, Pergamon Press, Ltd., Great Britain 1993 , 879-892.

Renn, M. J. et al., "Evanescent-wave guiding of atoms in hollow optical fibers", *Physical Review A* Feb. 1996, R648-R651.

Renn, Michael J. et al., "Flow- and Laser-Guided Direct Write of Electronic and Biological Components", *Direct-Write Technologies for Rapid Prototyping Applications* Academic Press 2002 , 475-492.

Renn, M. J. et al., "Laser-Guidance and Trapping of Mesoscale Particles in Hollow-Core Optical Fibers", *Physical Review Letters* Feb. 15, 1999, 1574-1577.

Renn, M. J. et al., "Laser-Guided Atoms in Hollow-Core Optical Fibers", *Physical Review Letters* Oct. 30, 1995 , 3253-3256.

Renn, M. J. et al., "Optical-dipole-force fiber guiding and heating of atoms", *Physical Review A* May 1997 , 3684-3696.

Renn, M. J. et al., "Particle manipulation and surface patterning by laser guidance", *Journal of Vacuum Science & Technology B* Nov./Dec. 1998, 3859-3863.

Renn, M. J. et al., "Particle Manipulation and Surface Patterning by Laser Guidance", *Submitted to EIPBN '98, Session AM4* 1998.

TSI Incorporated, et al., "How A Virtual Impactor Works", www.tsi.com Sep. 21, 2001.

Vanheusden, K. et al., "Direct Printing of Interconnect Materials for Organic Electronics", *IMAPS ATW, Printing an Intelligent Future* Mar. 8-10, 2002, 1-5.

Sobeck, et al., *Technical Digest 1994 Solid-State Sensor and Actuator Workshop*, 647, 1994.

Zhang, Xuefeng et al., "A Numerical Characterization of Particle Beam Collimation by an Aerodynamic Lens-Nozzle System: Part I. An Individual Lens or Nozzle", *Aerosol Science and Technology* vol. 36, Taylor and Francis 2002 , 617-631.

* cited by examiner

DIRECT WRITE# SYSTEM

CROSS-REFERENCE TO RELATED APPLICATIONS

This application is a continuation application of U.S. patent application Ser. No. 10/072,605, entitled "Direct Write™ System", to Michael J. Renn, filed on Feb. 5, 2002, now issued as U.S. Pat. No. 7,108,894, which is a continuation-in-part application of U.S. patent application Ser. No. 10/060,960, entitled "Direct Write™ System", filed Jan. 30, 2002 now abandoned, which is a continuation-in-part application of U.S. Ser. No. 09/584,997, entitled "Particle Guidance System", filed Jun. 1, 2000, and issued as U.S. Pat. No. 6,636,676, which is a continuation-in-part application of U.S. Ser. No. 09/408,621, entitled "Laser-Guided Manipulation of Non-Atomic Particles", filed on Sep. 30, 1999 now abandoned, which claims the benefit of filing of U.S. Provisional Patent Application Ser. No. 60/102,418, entitled "Laser-Guided Manipulation of Non-Atomic Particles", filed on Sep. 30, 1998, and the specifications thereof are incorporated herein by reference. This application also claims the benefit of filing of PCT Patent Application No. PCT/US99/22527, entitled "Laser-Guided Manipulation of Non-Atomic Particles", filed on Sep. 30, 1999; and of PCT Application No. PCT/US01/14841, entitled "Particle Guidance System", filed Jan. 30, 2002; and the specifications thereof are also incorporated herein by reference.

FEDERALLY SPONSORED RESEARCH OR DEVELOPMENT

The Invention described below was developed using funds from Government Contract No. N00014-99-C-0243 issued by the U.S. Office of Naval Research. Under the terms of the Contract, the Contractor and Assignee, the Optomec Design Company, of Albuquerque, N. Mex., retains rights in the Invention in accordance with Section 52.227-11 of the Federal Acquisition Regulations (Patent Rights-Retention by Contractor, Short Form).

FIELD OF THE INVENTION

The present invention relates generally to the field of precisely depositing a selected material on a substrate. More specifically, one embodiment of the present invention relates to methods and apparatus for generating discrete particles from a source material, creating parallel streams of discrete particles, and then guiding them onto a substrate to form a planar, conformal or three-dimensional feature on the substrate.

BACKGROUND OF THE INVENTION

Many industrial processes require the formation of layers of a material on a substrate or base. These processes include Ink Jet Printing, Photolithography and DuPont's Fodel® technology.

Ink Jet Printing

Ink jet printing is one well-known process that can be used to apply a layer of one material on a substrate. In most cases, ink jet printing is employed to place tiny droplets of ink onto a sheet of paper to create text or an image.

One kind of ink jet printer employs "thermal bubble" or "bubble jet" technology, in which ink is heated in a print head that includes hundreds or nozzles or orifices. The high levels of heat generated by resistors built into the print head vaporize the ink, and forms a series of single bubbles of ink which are propelled out of the nozzles toward a sheet of paper. In another kind of inkjet printing, an array of piezo-electric crystals is activated to vibrate and expel ink from a corresponding array of nozzles.

Both types of inkjet printers are remarkably accurate. A typical ink jet print head has 300 to 600 nozzles, and can form dots of many different colors of ink that are as small as 50 microns in diameter. All of the nozzles can be activated at once to produce complex applications of ink on paper that can even approach or match the resolution of conventional silver halide photography.

Although ink jet printing offers a relatively versatile and inexpensive process for applying a material to a substrate, ink jet printing is generally limited to placing exceedingly thin layers of ink on paper or cloth which are essentially two-dimensional. The viscosity ranges for ink jet printing are limited to ranges of one to ten cp. This limited range of viscosity in turn limits the variety of materials which may be deposited.

Photolithography

Photolithography is a purely planar process that is typically used in the semiconductor industry to build sub-micron structures. Photolithography may be used to build features in the 1~100-micron range, but is plagued by many severe limitations:

1) The thickness of the features ranges from 0.01 to 1 microns. As a result, mechanical connections may not be made to layer built using a photolithographic layer.
2) The photolithographic process is purely planar. Photolithographic structures formed on a substrate do not include three-dimensional features having a height of more than one micron.
3) Photo lithographical processes, which use a process of vaporization of the deposited metal, needs to be run in a vacuum chamber at a temperature which supports the high temperature required to vaporize the metal.
4) Finally, photolithography requires a mask.

Fodel® Materials

According to the DuPont Corporation. Fodel® materials incorporate photosensitive polymers in a thick film. Circuit features are formed using UV light exposure through a photomask and development in an aqueous process. Fodel® dielectrics can pattern 75 micron vias on a 150 micron pitch, and Fodel® conductors can pattern 50 micron lines on a 100 micron pitch. Fodel® materials extend the density capability of the thick film process to allow densities typically achievable using more costly thin film processes.

Fodel® is a process in which a thick film is placed on the substrate. A mask is then used to expose areas of the thick film to cure the material. The substrate is then chemically etched to remove the uncured material. The Fodel® process can be performed in an ambient environment. The limitations to Fodel® are:

1) The Fodel® process is purely planar. No three-dimensional features can be produced.
2) The Fodel® process uses a chemical etching process which is not conducive to all substrates.
3) Like photolithography, the Fodel® requires a mask.
4) The material costs of the Fodel® process are relatively high.
5) The Fodel® process is limited to features larger than 50 microns.

Other techniques for directing a particle to a substrate involve the use of lasers to create optical forces to manipulate a source material. "Optical tweezers" allow dielectric particles to be trapped near the focal point of a tightly focused, high-power laser beam. These optical tweezers are used to manipulate biological particles, such as viruses, bacteria, micro-organisms, blood cells, plant cells, and chromosomes.

In their article entitled *Inertial, Gravitational, Centrifugal, and Thermal Collection Techniques*, Marple et al. disclose techniques which may be used to collect particles for subsequent analysis or for particle classification.

TSI Incorporated describes how a virtual impactor works on their website, www.tsi.com.

Another method for applying a source material to a substrate is described in a co-pending and commonly-owned U.S. patent application Ser. No. 09/584,997 filed on 1 Jun. 2000 and entitled Particle Guidance System by Michael J. Renn. This Application discloses methods and apparatus for laser guidance of micron-sized and mesoscopic particles, and also furnishes methods and apparatus which use laser light to trap particles within the hollow region of a hollow-core optical fiber. This invention enables the transportation of particles along the fiber over long distances, and also includes processes for guiding a wide variety of material particles, including solids and aerosol particles, along an optical fiber to a desired destination.

The co-pending Application by Renn describes a laser beam which is directed to an entrance of a hollow-core optical fiber by a focusing lens. A source of particles to be guided through the fiber provides a certain number of particles near the entrance to the fiber. The particles are then drawn into the hollow core of the fiber by the focused laser beam, propagating along a grazing incidence path inside the fiber. Laser induced optical forces, generated by scattering, absorption and refraction of the laser light by a particle, trap the particle close to the center of the fiber and propels it along. Virtually any micron-size material, including solid dielectric, semiconductor and solid particles as well as liquid solvent droplets, can be trapped in laser beams, and transported along optical fibers due to the net effect of exertion of these optical forces. After traveling through the length of the fiber, the particles can be either deposited on a desired substrate or in an analytical chamber, or subjected to other processes depending on the goal of a particular application.

The problem of providing a method and apparatus for optimal control of diverse material particles ranging in size from individual or groups of atoms to microscopic particles used to fabricate articles having fully dense, complex shapes has presented a major challenge to the manufacturing industry. Creating complex objects with desirable material properties, cheaply, accurately and rapidly has been a continuing problem for designers. Producing such objects with gradient or compound materials could provide manufacturers with wide-ranging commercial opportunities. Solving these problems would constitute a major technological advance, and would satisfy a long felt need in the part fabrication industry.

SUMMARY OF THE INVENTION

The Direct Write™ System provides a maskless, mesoscale deposition device for producing continuous, collimated, parallel streams of discrete, atomized particles of a source material which are deposited on a substrate. Unlike ink jet printers and conventional photolithographic deposition equipment, the present invention can manufacture planar, conformal or three-dimensional surfaces. One embodiment of the present invention is extremely accurate, being capable of using 1 μm droplets to form features as small as 3 μm. The invention is also capable of delivering one billion particles per second to a substrate at scan rates of one meter per second. In addition to being able to deposit a wide variety of inorganic materials such as metals, alloys, dielectrics and insulators. The present invention may also be used to manipulate oraganic and biological entities in droplets such as enzymes, proteins and viruses.

In an alternative embodiment, the invention may also comprise a virtual or cascade impactor to remove selected particles from a stream of gas to enhance deposition.

An appreciation of other aims and objectives of the present invention may be achieved by studying the following description of preferred and alternate embodiments and by referring to the accompanying drawings.

A BRIEF DESCRIPTION OF THE DRAWINGS

Figure 3:
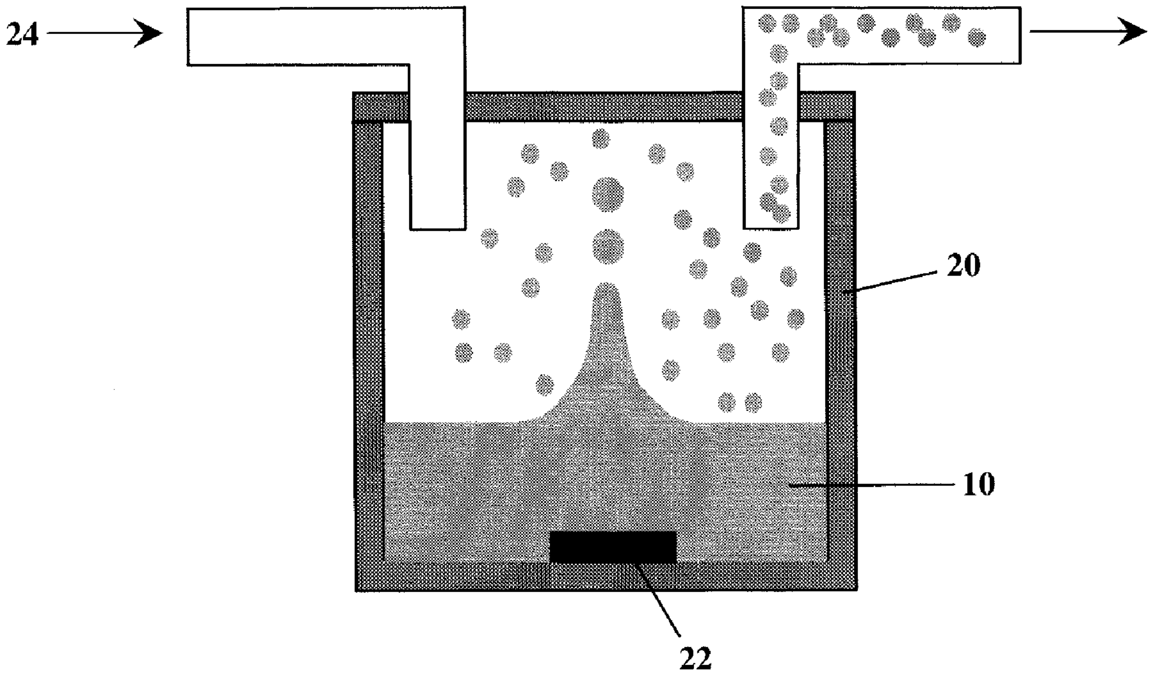

FIG. 3 reveals some details of an aerosol chamber, which is used to create discrete particles of a source material.

Figure 4:
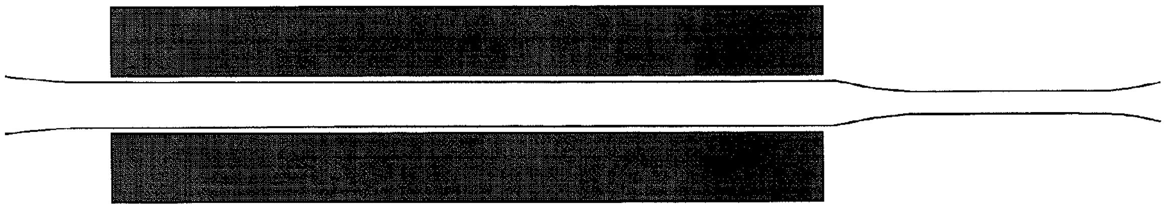

FIG. 4 portrays a compressed air jet.

Figure 5A:
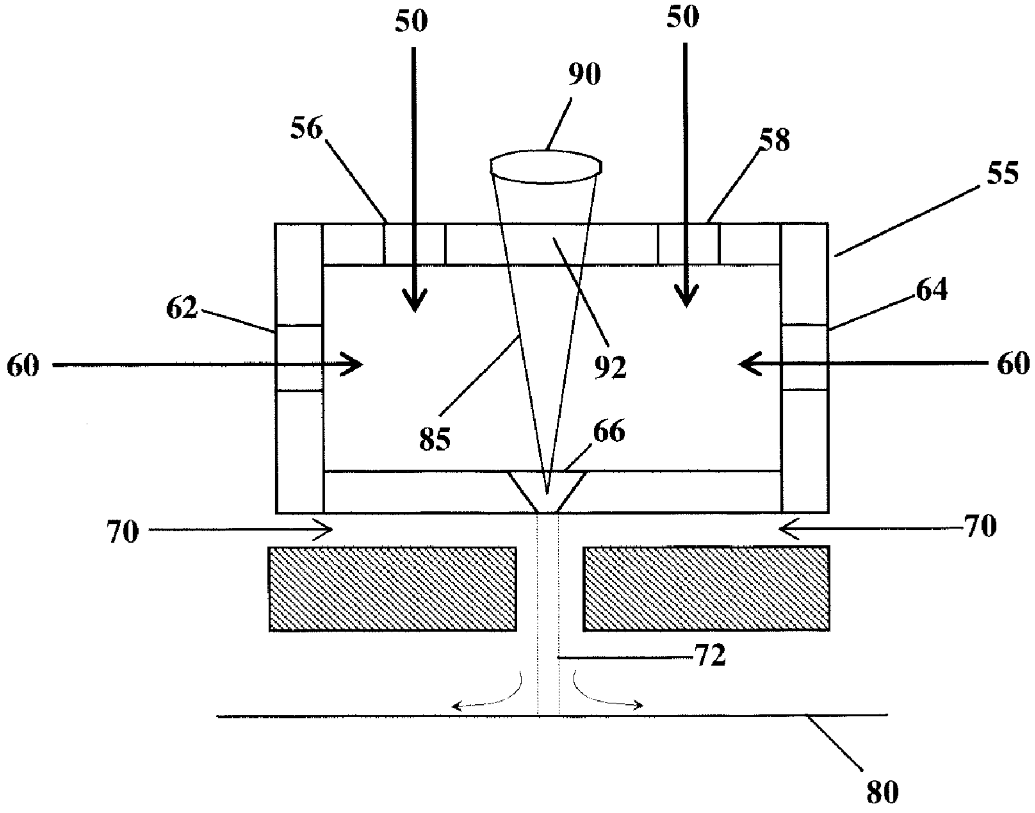
Figure 5B:
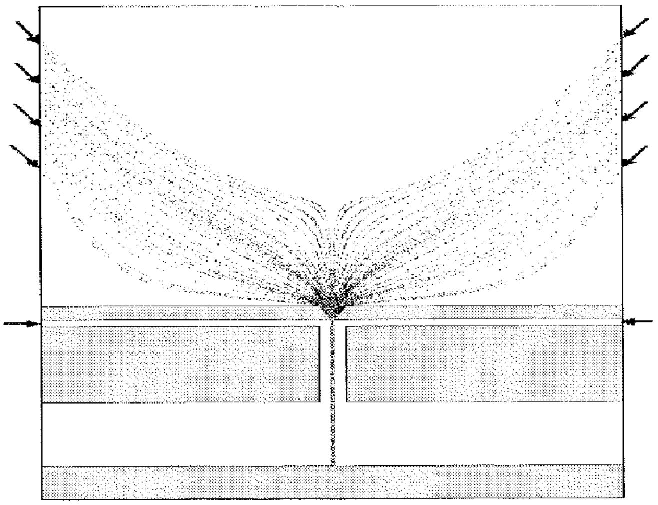

FIG. 5 offers another view of one of the preferred embodiments of the invention.

Figure 6:
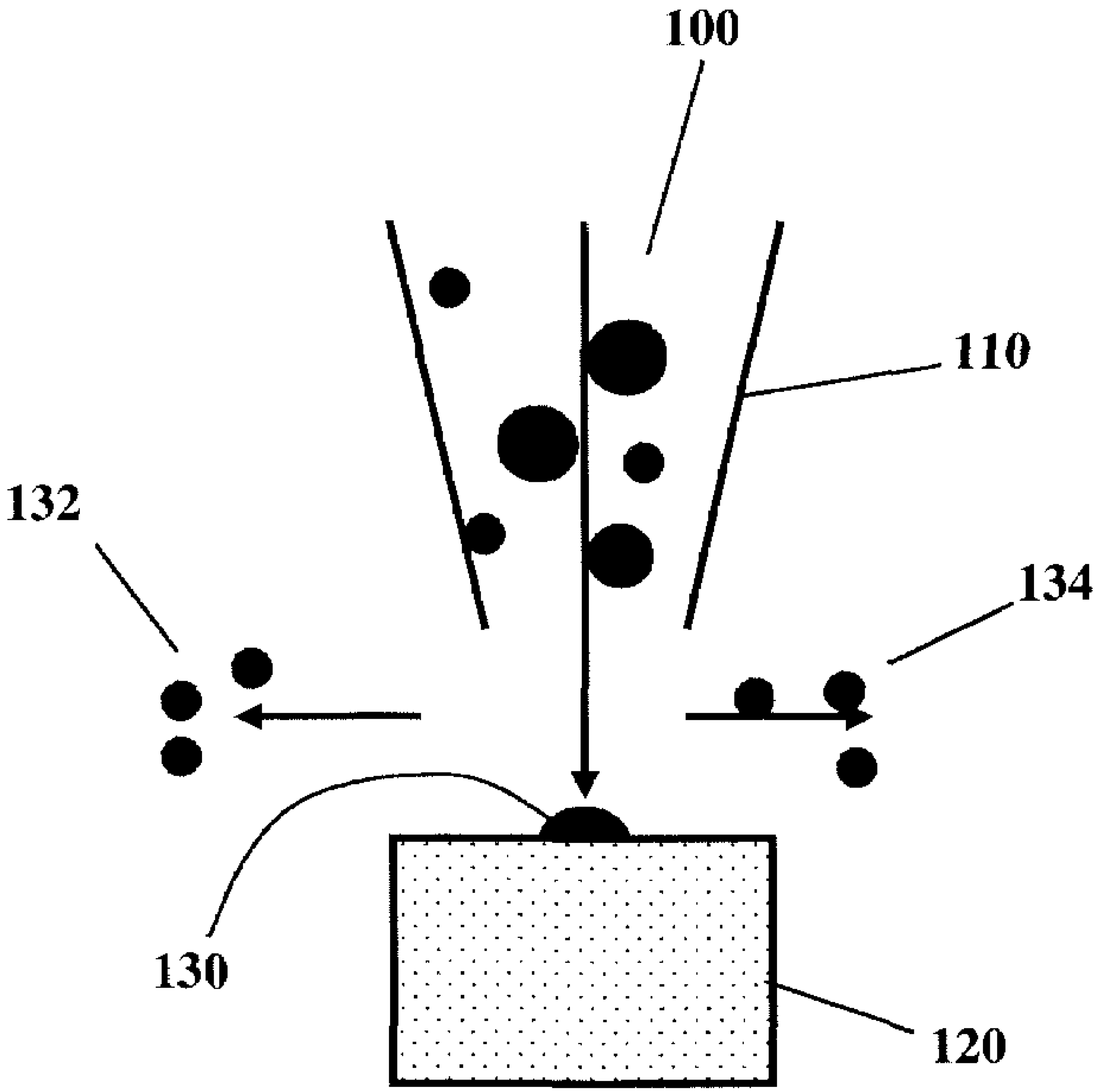

FIG. 6 supplies a schematic depiction of cascade impaction.

Figure 7:
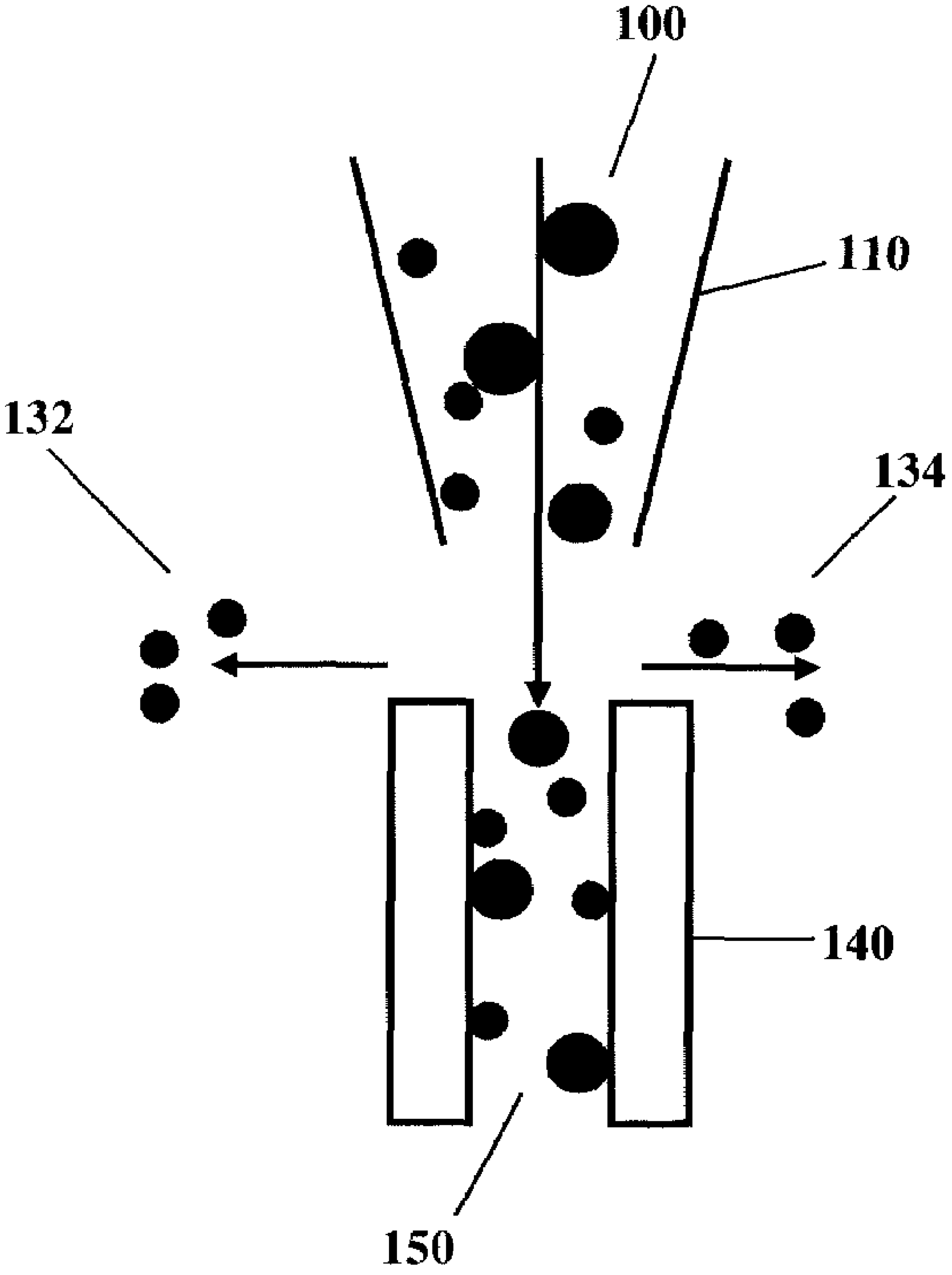
Figure 8:
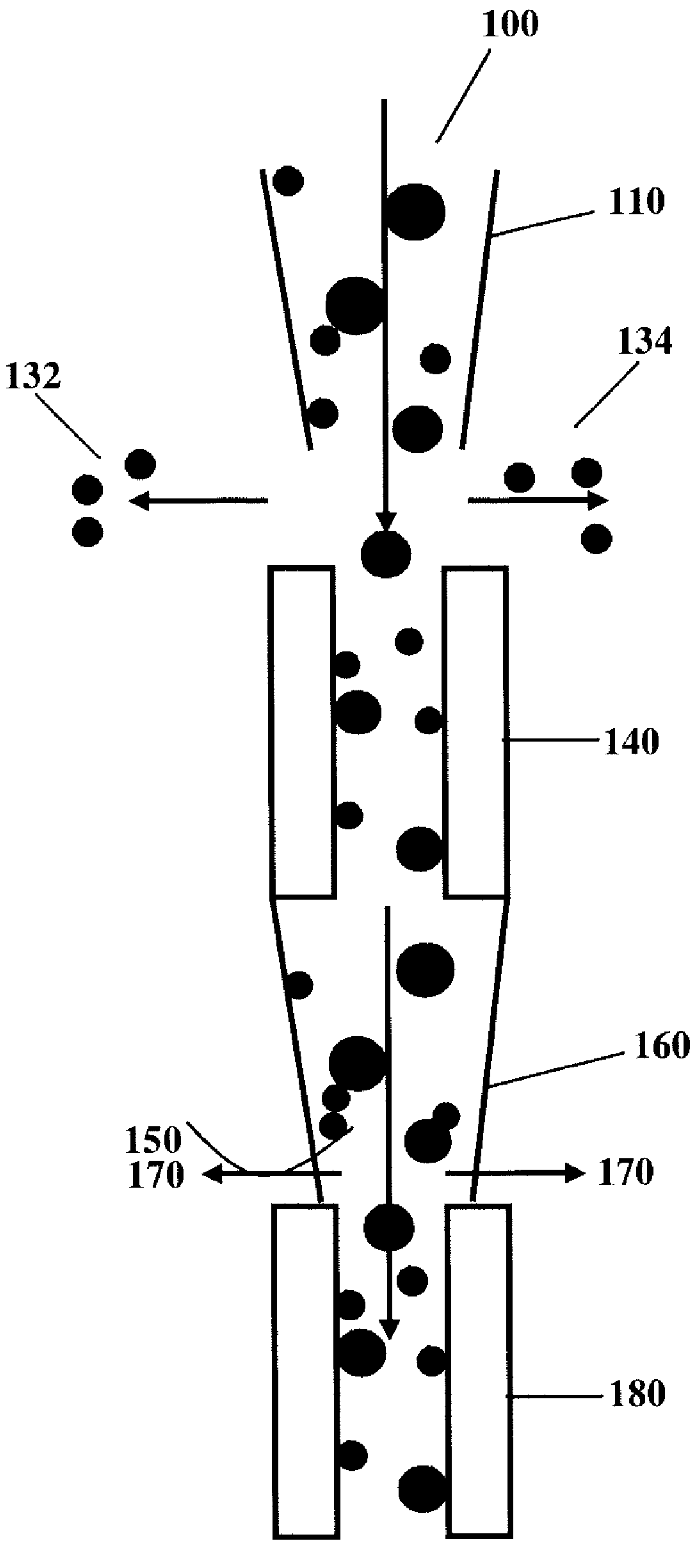

FIG. 7 provides a schematic view of a virtual impactor, while FIG. 8 shows virtual impactors in series.

Figure 9:
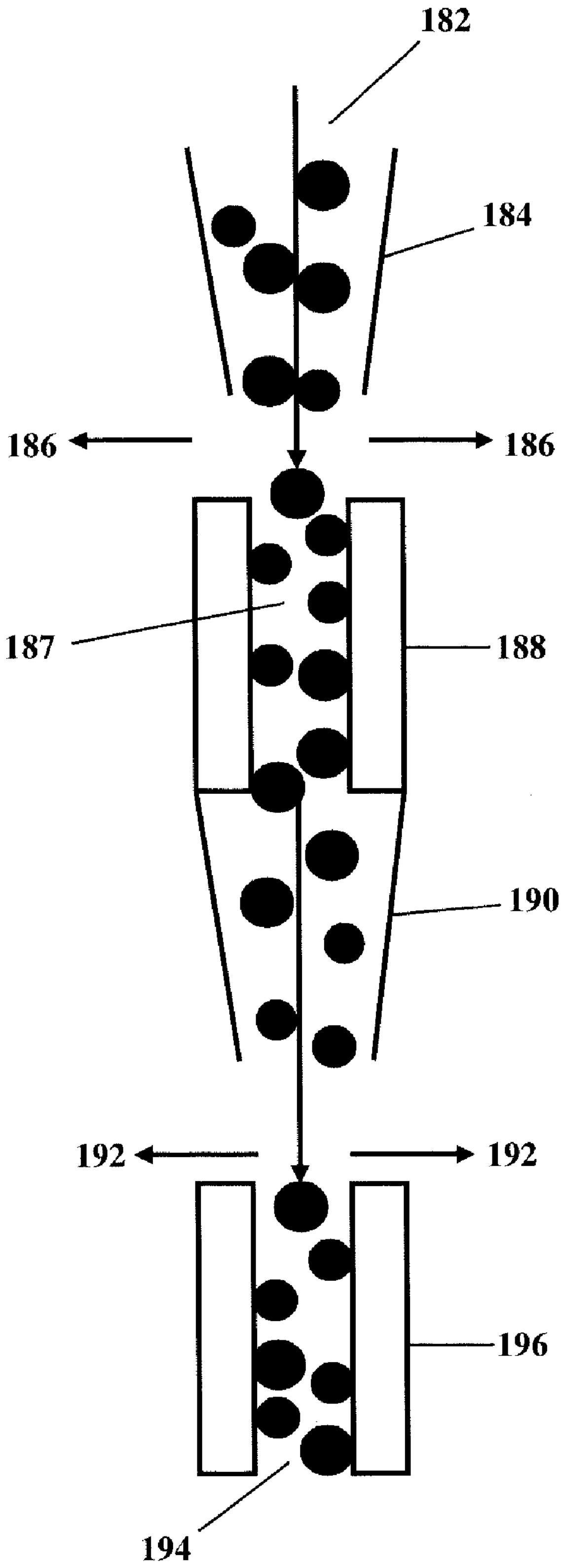

FIG. 9 supplies a view of particle sorting at an atomization unit and virtual impactors in series.

Figure 10:
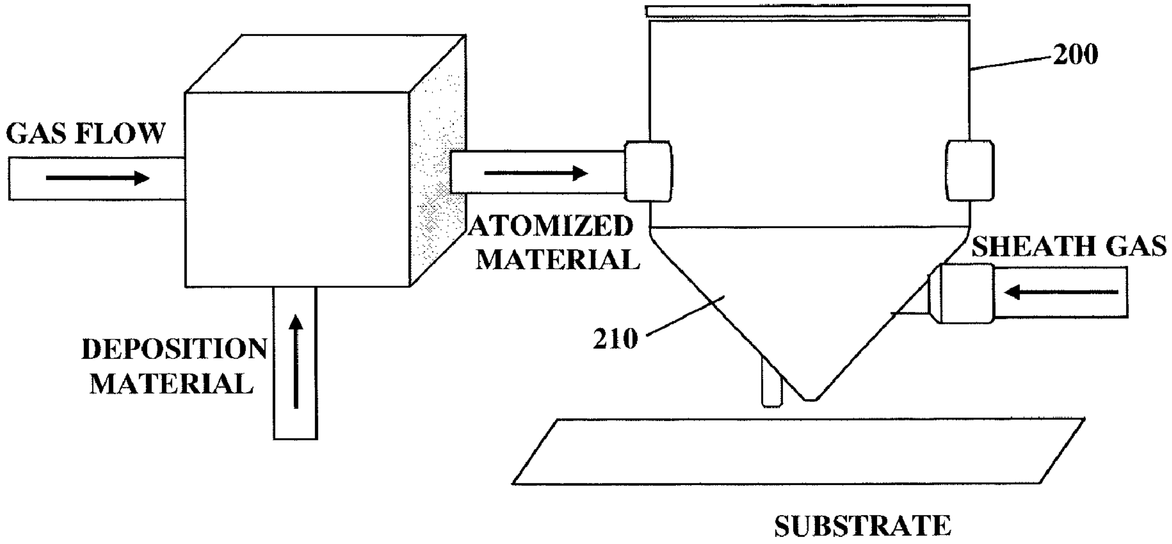

FIG. 10 is a schematic of one of the preferred embodiments of the invention.

Figure 11:
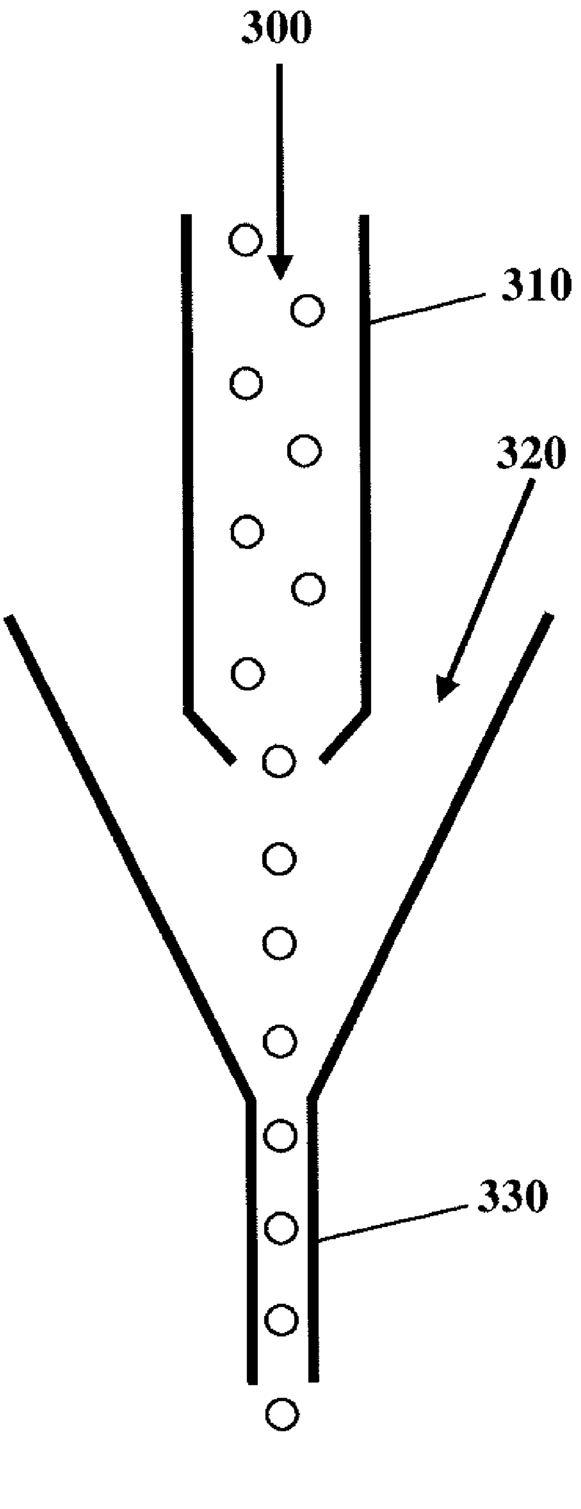

FIG. 11 depicts the flow of an aerosol stream and sheath gas.

Figure 12:
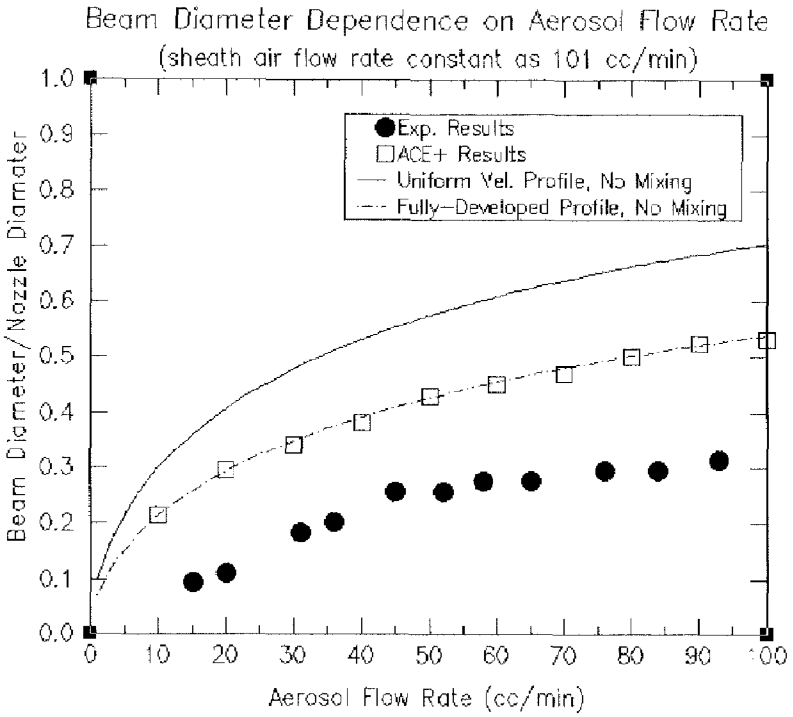
Figure 12:
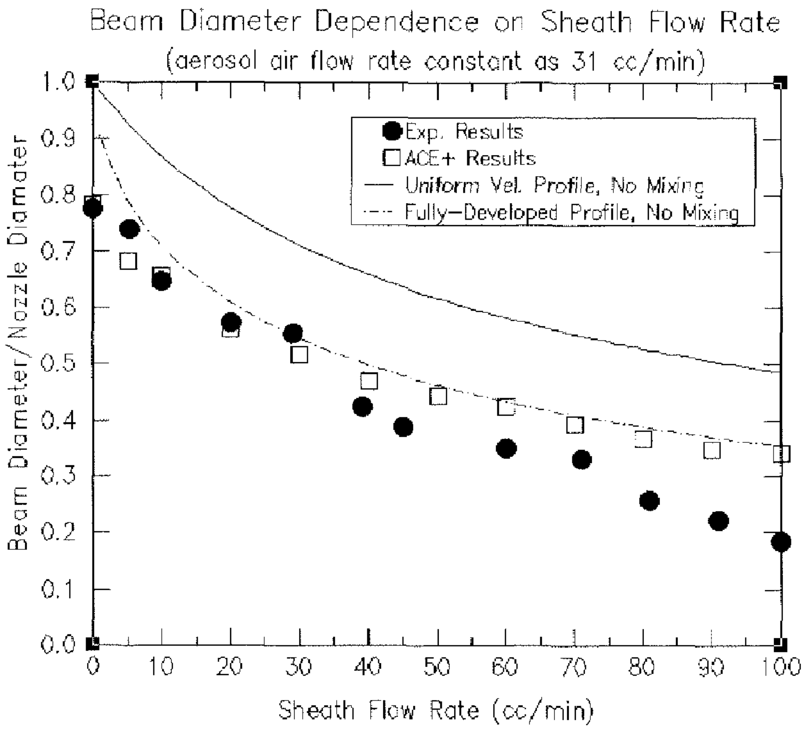

FIG. 12 presents two graphs showing beam diameter and its dependence upon aerosol and sheath flow rates.

Figure 13:
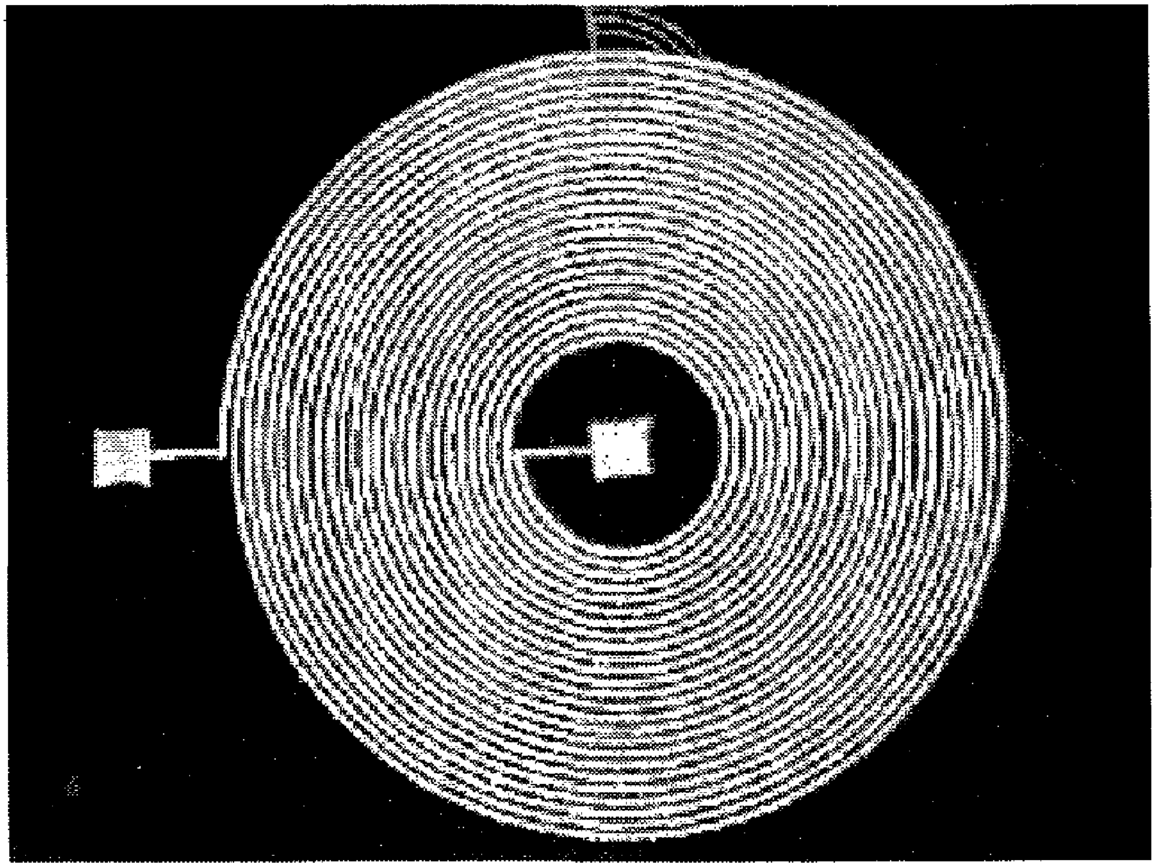

FIG. 13 is an image of a spiral formed with the present invention.

Figure 14:
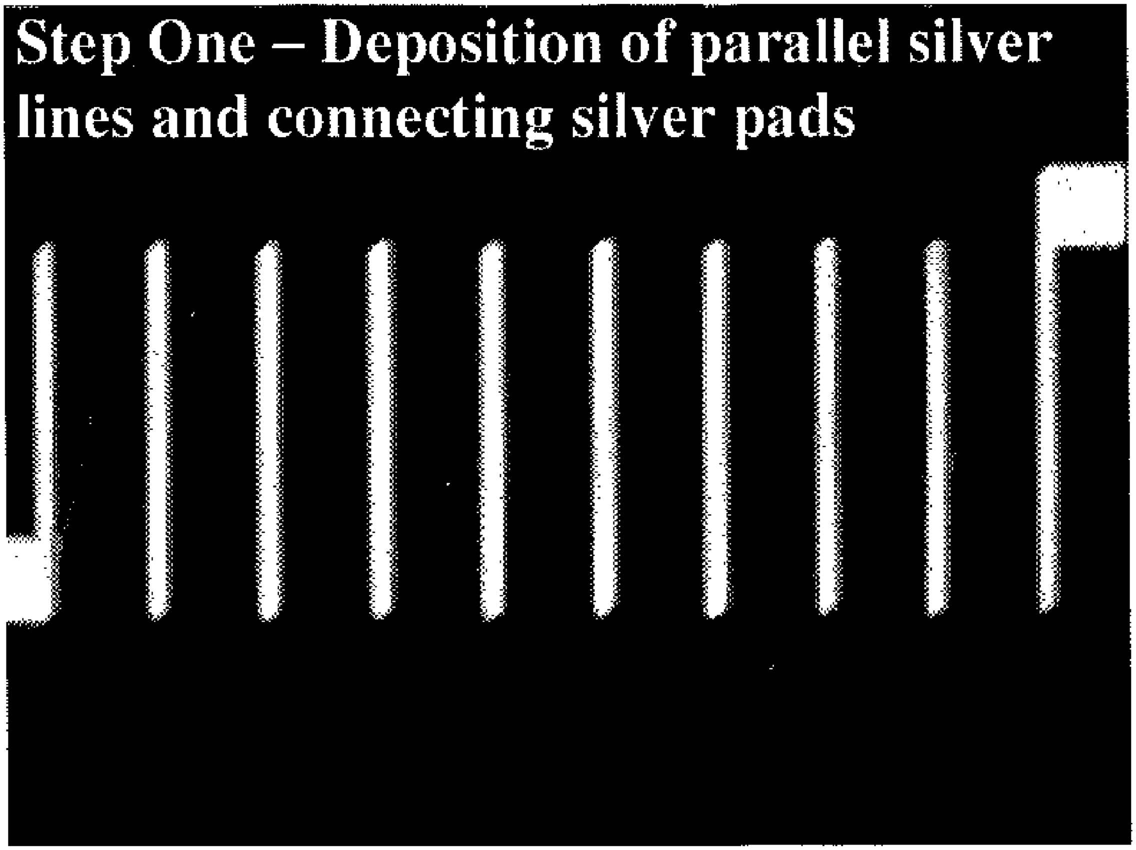
Figure 15:
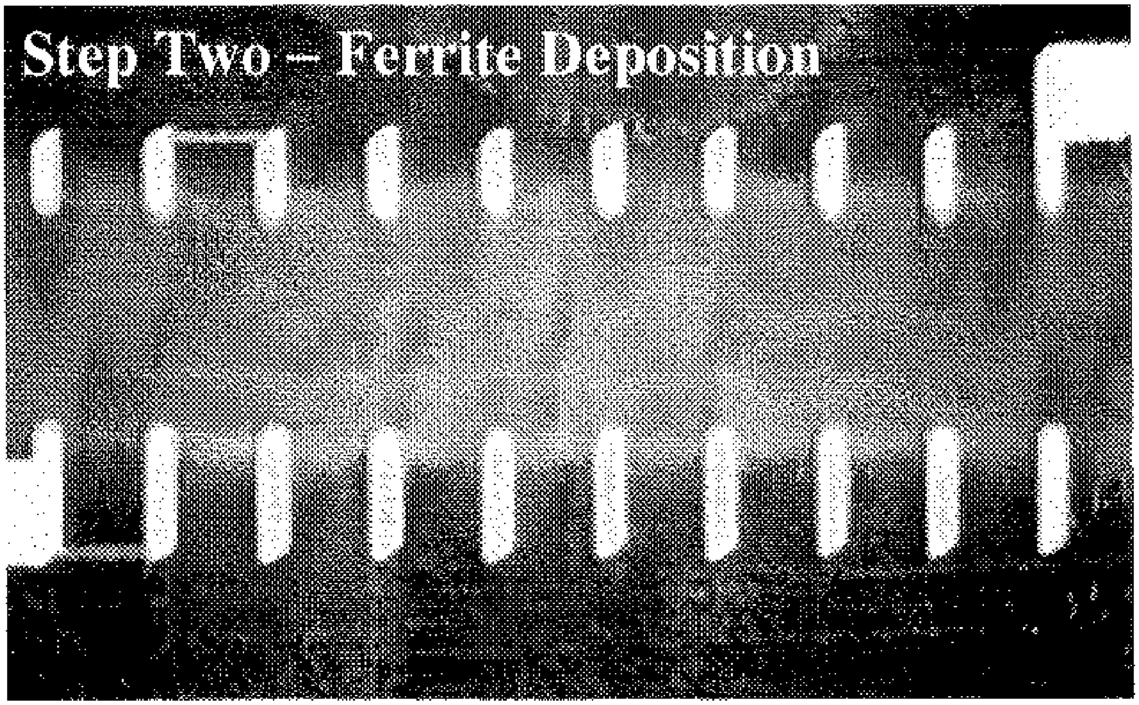
Figure 16:
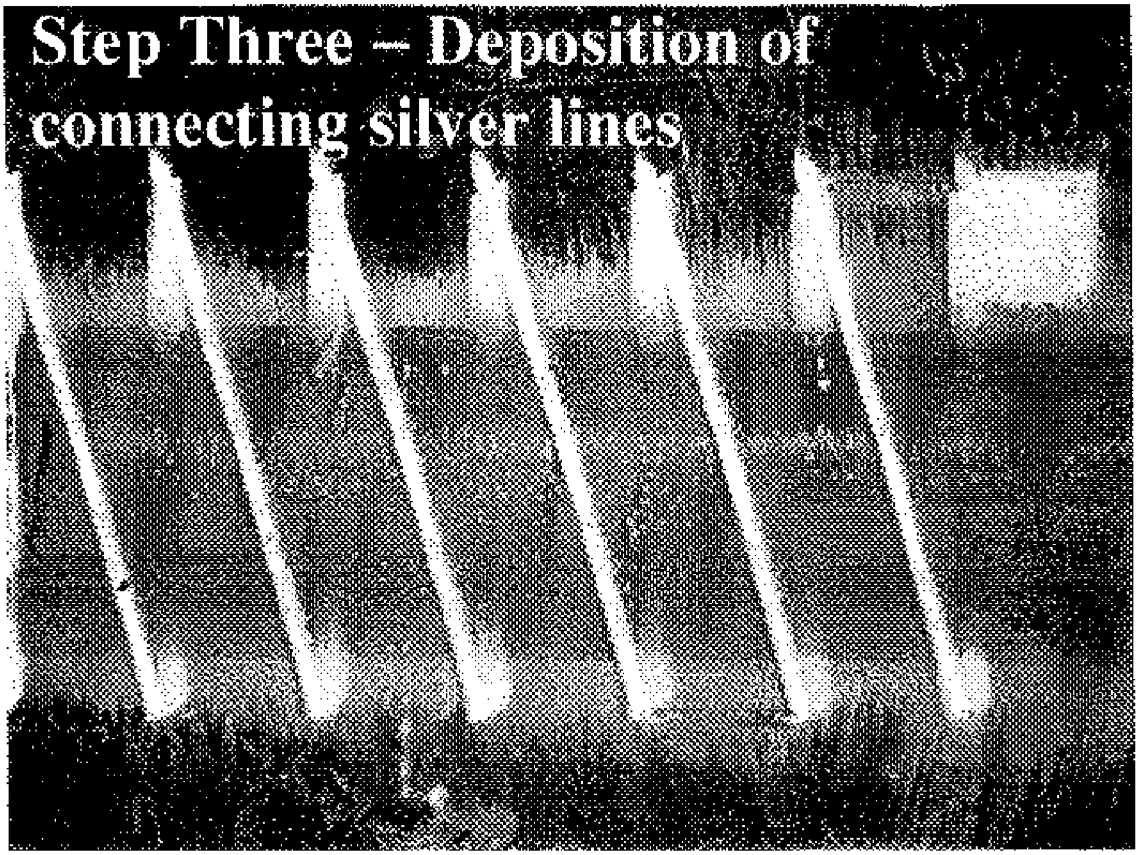

FIGS. 14, 15 and 16 are images of products deposited using the present invention.

Figure 17:
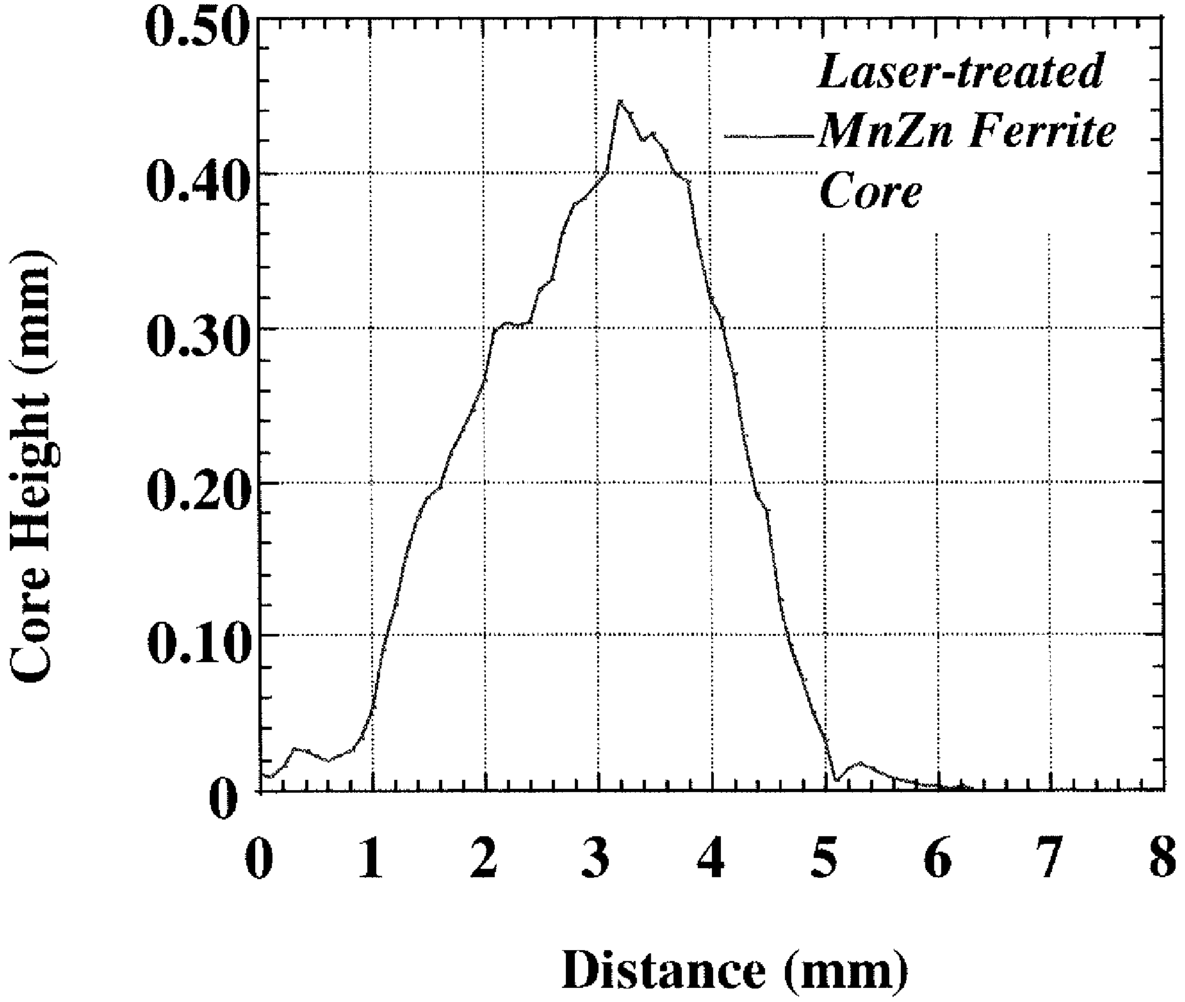

FIG. 17 is a graph showing core height versus distance.

A DETAILED DESCRIPTION OF PREFERRED & ALTERNATIVE EMBODIMENTS

I. Direct Write™ Methods & Apparatus

Figure 1:
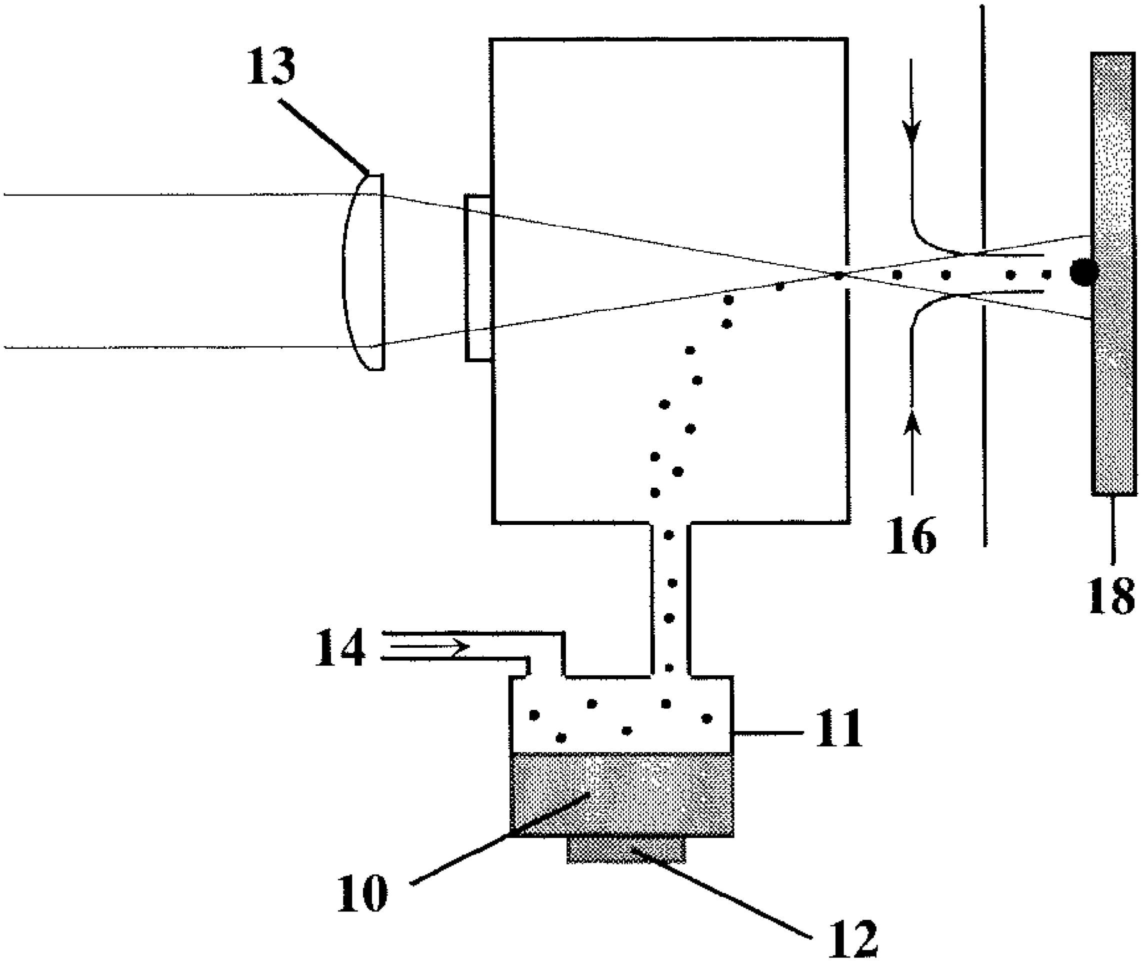
FIG. 1 is a schematic depiction of one of the preferred embodiments of the present invention, which utilizes an energy source and a flow of gas to direct particles toward a substrate.

FIG. 1 presents a schematic view of one of the preferred embodiments of the Direct Write™ System, which comprises methods and apparatus for maskless, mesoscale deposition of a source material on a substrate. Unlike many previous deposition systems which are restricted to the formation of planar layers on a flat substrate, the present invention is capable of forming a wide variety of planar, non-planar, conformal or three-dimensional features on a substrate having virtually any profile or topography.

In one embodiment, the invention comprises a source of material 10 contained by an enclosure 11. Although the a preferred embodiment generally includes a source material in liquid form, the source may comprise any aggregation, mixture, suspension or other combination of any materials in any physical phase. The source of material 10 is contained in a vessel, pool, volume or chamber which is coupled to or in communication with an atomizer 12. In general, the atomizer 12 is responsible for reducing or dividing the source material into discrete particles. The size of the discrete particles may be controlled by the interaction of the physical properties of the source material and/or the atomizer. Any device or means which forms relatively smaller particles from larger particles, from a reservoir of fluid, or from a solid mass may function as the atomizer 12. In this Specification and in the Claims that follow, the term "particle" generally refers to discrete portions of a material or materials which have been rendered from a more extensive supply. Various embodiments of the invention, the atomizer 12 may comprise a device that utilizes an ultrasound or pneumatic device, or that employs a spray process, forms an aerosol or condenses particles from a vapor.

The invention includes some means to apply force 14 to the discrete particles of source material 10 which are produced by the atomizer 12. One of the preferred embodiments of the invention utilizes a carrier gas as a force application means to propel the particles. The typical carrier gas flow rates range from one to ten liters per minute. The preferred type of carrier gas is a gas which does not react adversely to the material which is deposited on the substrate. Nitrogen, argon and helium are excellent carrier gases.

FIG. 1 exhibits another embodiment of the invention, which employs a laser and a lens 13 to direct optical energy into a cloud of discrete particles produced by the atomizer 12. This optical energy propels the particles in a desired direction of flight.

Alternative embodiments may incorporate some other energy source to apply force to the particles. Any device which imparts energy to control the direction and speed of the particles could be used in the invention, including devices which generate heat or which produce electromagnetic or other fields that are capable of controlling a stream of particles.

In addition to a means to apply force 14 to the discrete particles, the invention utilizes some means of collimation 16 to control, regulate or limit the direction of flight of the discrete particles. In one embodiment, a hollow column of co-flowing air surrounds the stream of particles, forming a barrier or sheath of gas 16 that guides the particles as they travel from the force application means 14 toward a substrate 18. This collimating gas 16 exerts radial forces on the stream of particles to restrict and focus their movement toward the substrate 18. The sheath gas stream may be produced from a pressurized system. The sheath gas moves through a nozzle that is specifically designed to entrap and focus the gas stream which carries the particles. Different geometric designs of the sheath gas orifices enable larger or smaller deposition areas.

In alternative embodiments of the invention, the collimation means 16 may comprise an aperture in a thin sheet, or a hollow core optical fiber.

In this Specification and in the Claims that follow, the term "substrate" refers to any surface, target or object which the particles strike or on which they are deposited. The substrate may be flat or generally planar, or may be characterized by a complex three-dimensional profile. In the various embodiments of the invention, the Direct Write™ apparatus may utilize a deposition assembly which moves over a stationary substrate, or may employ a deposition assembly which remains fixed while the substrate moves.

The invention may be used to deposit on virtually any substrate material. In specific embodiments of the invention, the substrate material comprises green tape ceramic, printed circuit boards, MEMS, flexible circuits formed on Kapton™ or Mylar™, clothes fabrics, glass or biologic materials.

The present invention offers a superior deposition device compared to prior, conventional techniques such as ink jet printing. The Direct Write™ System provides a versatile tool for a wide variety of industrial and biomedical applications, and offers the following highly beneficial features:

Maskless

Performed in an Ambient Environment

Three-Dimensional or Conformal:

Manufacture Features having Depth of 1~100 Microns

High Velocity (~10 m/s)

Variable Beam Diameter (10 μm)

High Throughput (~$10^9$ $s^{-1}$ in 100 μm beam)

Reduced Clogging

Long Working Distance (~few cm)

Deposition of Materials with Viscosities Ranging from 1~10,000 cp

Simultaneous Laser Treatment

Unlike ink jet print heads, which produce droplets one at a time to produce a single serial stream of droplets from each print head orifice, the Direct Write™ System is capable of producing continuous, parallel streams of discrete particles for deposition. By controlling the viscosity of the atomized particles, the present invention is capable of depositing three-dimensional features which adhere to the substrate without running. The viscosity may be controlled by thinning the material with a solvent, by changing the fundamental design of the material, or by changing the temperature of the material or of the chamber containing the particles. In an optional feature of the invention, the particles may undergo a physical or chemical change before deposition to enhance the characteristics of the final deposited material on the substrate.

A heating process may be employed to change the physical properties of the material. In one embodiment, drops of solvent which hold the particles of material to deposit are removed.

The present invention also provides benefits which are not achievable by photolithographic processes, which require expensive masks which are hard to change, and which are limited to a flat substrate. One embodiment of the invention may be implemented at a relatively low range of temperatures.

The present invention is capable of depositing materials at room temperature. Many of these materials can cure at room temperature. One advantage offered by the invention is the ability to lay down materials in the mesoscopic range (from 1 to 100 microns). If the material needs a thermal post treatment, the deposition can be followed with a laser treatment. The laser beam provides a highly localized thermal and photonic treatment of the material. The laser beam is capable of treating only the deposited material after deposition without affecting the underlying substrate.

The deposition process may involve multiple layers of source material, or may involve immiscible materials. Unlike other previous deposition systems, the present invention may be practiced in an uncontrolled atmosphere.

Unlike some other previous deposition devices, the present invention allows for a variety of substrate treatments during the deposition process. Alternative embodiments of the invention include capabilities for heating the substrate by laser illumination or by increasing the ambient temperature. The substrate may also be cooled during deposition by reducing ambient temperature. Other alternative treatment steps may include photoactivation with a laser, irradiation with infrared light, or illumination with an arc lamp. Another substrate treatment comprises a washing or rinsing process.

Figure 2:
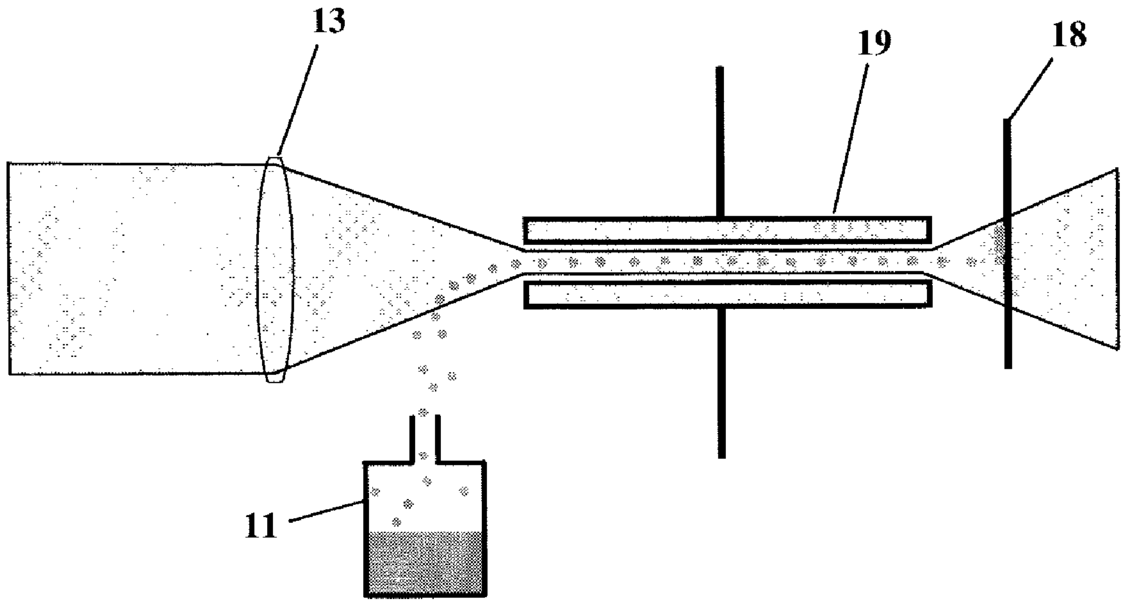
FIG. 2 is a schematic illustration of an alternative embodiment of the invention, which includes a hollow core optical fiber.

FIG. 2 is a schematic illustration of an alternative embodiment of the invention, which includes a hollow core optical fiber 19. The invention has the following features:

Small droplets (~1 μm);

Dense aerosols (~$10^{16}$ $m^3$);

Accuracy to 3 μm;

Single particle to $10^9$ particles/s;

Throughput to 0.25 $mm^3$/s;

Low power (~50 mW);

High scan rate (~1 m/s);

Dense, conductive materials (ρ~2× bulk).

FIG. 3 reveals some details of an aerosol chamber 20, which is used to create discrete particles of a source material. Ultrasonic transducer 22 atomizes material 10 in aerosol chamber 20. Aerosolized particles of material 10 are then entrained in gas flow 24 and forced out of aerosol chamber 20 by gas flow 24, preferably to the delivery system. Gas flow 24 optionally comprises air. Some features of the aerosol chamber of the present invention include:

Small droplets (~1 μm, 1 fL);

Dense aerosols (μ$10^{16}$ $m^3$);

100 μL minimum sample;

All solids, all precursors, or solid/precursor mixtures;

Precursor based alloys with atomic scale mixing;

Organic and biological entities in droplets (enzymes, proteins, virus, etc.).

FIG. 4 portrays a compressed air jet 26 having the following features:

Particulate in Suspension;

Large Particles (1-30 μm);

High Viscosity Fluids;

Particles+Precursor binder;

Animal Cells+Media;

Bacteria;

Virus.

FIG. 5(*a*) depicts a schematic for one of the preferred embodiments of the invention. In this embodiment, particle laden air 50 enters deposition head 55 through ports 56, 58. Sheath air 60 enters through ports 62, 64 to surround particle laden air 50. The air/particle stream then is narrowed as it passes through nozzle 66. Coflowing air 70 then surrounds the stream, forming jet 72 which impinges on substrate 80. Laser beam 85 passes through lens 90 and glass window 92 for processing the particles in jet 72 or on substrate 80. FIG. 5(*b*) depicts a computer simulation of particle flow for an alternative embodiment in which the particle laden air enters the deposition head through ports in the side of the deposition head.

Precursors

The present invention also offers the ability to simultaneously deposit solid particles and liquid "precursors," where the liquids serve to fill the gaps between solid particles. In general, a precursor is any material that can be decomposed thermally or chemically to yield a desired final product. Coalescence of liquid precursors on the substrate and subsequent decomposition by laser heating to form a final product on the substrate and sintering of the deposited material by laser, or chemical binding are additional techniques made possible by the invention. A number of precursor and particulate materials may be used to create composite structures having gradient chemical, thermal, mechanical, optical and other properties.

II. Removal of Particles from a Stream of Gas

There are several well-known technologies that involve the removal of particles from a stream of gas. Two of the more common methods are known as cascade impaction and virtual impaction. The most widely used are the inertial classifiers.

Cascade Impaction

Cascade impaction is a method which may be used to sort larger particles from smaller ones. FIG. 6 presents a pictorial description of the cascade impaction method. A gas stream 100 is produced to carry particles of material of varying size and mass. This gas stream is projected through a nozzle 110 towards an impaction plate 120. In a steady state condition, the gas produces streamlines above the impaction plate. Particles with larger mass and greater momentum are projected through these streamlines, and strike the impaction plate directly at impaction point 130. These particles accumulate on the surface of the impaction plate. Particles with smaller mass and less momentum are carried in the streamlines, and generally do not strike the impactor plate. These smaller particles continue to travel in the gas stream 132, 134, commonly know as the "major flow."

By optimizing the geometry of the nozzle and impaction plate relative to the gas stream, a method to sort large particles from small ones may be implemented using the cascade impactor. The smaller particles may be collected, or utilized in a down stream process. As shown in FIG. 6, the larger particles are "lost" from the gas stream as they accumulate on the surface of the impactor plate. These larger particles can not be utilized in any down stream processes.

Virtual Impaction

FIG. 7 supplies a schematic view of a virtual impactor. Virtual impaction uses the same principles as cascade impaction, except that an orifice 140 allows the larger particles to continue down stream in a "minor flow" 150. The fundamental difference between a cascade and virtual impactor is that the larger particles are preserved in the gas stream using the virtual impactor. Thus the larger particles may be utilized by employing virtual impaction.

Applications of Virtual and Cascade Impaction

These two impaction methods were developed for the spraying of particles without any consideration to the density or number of particles in the gas stream. If small particles are desired, then a cascade impactor may be used to eliminate the large particles. If large particles are desired, then a virtual impactor may be used to eliminate the small particles. Typical uses of cascade and virtual impactors arc particle size sorting and sampling.

Gas Removal Process

The present invention enables the direct write of most electronic materials (conductors, resistors, dielectrics). In this application, an atomizer emits a gas stream laden with various size particles. The gas stream from the atomizer flows at the rate of approximately 5 liters per minute. This gas stream flows through a virtual impactor, which strips off 4.95 liters per minute of gas. The remaining gas stream ultimately flows through the deposition head at a rate of 0.050 liters per minute. In this process, it is desirable to strip off only gas, and have the electronic component particles generated at the atomizer be contained in the flow which ultimately impacts the substrate. The highest possible number of particles in the gas stream is the most desirable. The gas stream density can be defined as the number of particles within a given volume of gas.

Gas Stream Density=Number of Particles/Unit of Carrier Gas

In this equation, the number of particles is determined by the atomization method. Once this method is selected, the number of particles generated is fairly constant and cannot be dramatically increased. To increase the gas stream density, it is desirable to remove excess gas from the carrier stream without removing the deposition particles. Stripping off excess gas while carrying the same number of particles would increase the particle density.

The present invention includes several methods to increase the gas stream density.

Method One—A Series of Virtual Impactors

FIG. 8 shows one method of densifying the gas stream. The first method involves placing a number of virtual impactors in series to strip off the excess gas. The first impactor strips off both carrier gas and the smaller particles. After minor flow 150 is passed through second nozzle 160, the second virtual impactor (and any number after) strips off only carrier gas in second major flow 170, 172 while the larger particles flow through second orifice 180. In this method, a series of virtual impactors can be used to densify the gas stream by stripping off more and more of the carrier gas.

Method Two—Particle Sorting at the Atomizing Unit

FIG. 9 shows a second method to densify the gas stream. This method employs a virtual impactor (not shown) at the exit of the atomizing unit. This impactor would be used to sort the particle stream prior to introduction into the gas stripping virtual impactors so that only large particles remain entrained in entering particle/gas stream 182. FIG. 9 depicts two air-stripping virtual impaction stages. The first stage comprises nozzle 184; only carrier gas is removed in first major flow 186. Initially densified particle/gas stream 187 then passes through first orifice 188 and second nozzle 190, after which more carrier gas is stripped off in second major flow 192. Further densified particle/gas stream 194 then passes through second orifice 196. Both major flows strip off carrier gas only; no particles are removed from the particle/gas streams. Essentially, all of the particles in the gas stream would be sized to permit a direct pass through each gas stripping virtual impaction stage.

III. A Preferred Embodiment of the Invention & its Applications

One embodiment of the present invention includes a process for producing features in the mesoscale range, i.e., from 1 to 100 microns, which avoids many of the problems that plague prior thick film and thin film technologies. Thick film techniques typically use a screen print process to produce features down to about 100 microns wide. Thin film techniques employ masks and photoresists to produce sub-micron features, and are costly and complex.

The present invention is capable of depositing electronic materials onto low-temperature, planar and non-planar substrates, without the use of masks or photoresistive deposits. Simpler and less expensive than thin-film techniques, the present invention can deposit 25-micron lines of inorganic (and organic) materials onto polymer, glass, silicon, and alumina and other ceramic substrates. One embodiment of the invention, Maskless Mesoscale™ Materials Deposition (M3D™), deposits aerosolized particles as small as 20 nanometers in diameter using aerodynamic focusing. The particle beam may be focused down to a 25-micron diameter. Approximately one billion particles per second can be deposited, with accuracies on the order of 25 microns. After the deposition process is completed, the material is decomposed or densified to produce the desired electrical and mechanical properties.

Typical thick film techniques deposit materials that must be fired well above 400° C., limiting the process to high-temperature substrates. However, the present invention is capable of depositing materials onto low-temperature substrates, and then using thermal or laser processing to obtain the desired properties by virtue of the initial precursor chemistry or localized laser heating. Specifically, the present invention can deposit electronic materials onto low-cost polymer substrates that cannot withstand high-temperature oven fires.

The present invention allows manufacturers to integrate many active and passive components into one compact, lightweight, and conformal electronic system. Surface-mount resistors, capacitors, and inductors occupy most of the surface of a typical PWB. The present invention can embed these components into the board. By embedding components and reducing interconnect pitch and line widths, a reduction in area of approximately 70 percent may be obtained for today's standard PWB. As a specific example, this capability will allow PWB designers to populate boards with the components required by next-generation wireless devices. Additionally, the present invention can precisely deposit metal onto non-planar surfaces for flex circuit manufacturing applications. Other applications include bond-pad redistribution, rework and repair of electronic circuitry, custom deposition for under-bump metallization, and custom bump fabrication for flip-chip interconnects.

One embodiment of the invention includes a direct-deposition process which may be employed to produce electronic structures down to the 25-micron (Mesoscale) dimension range. This process can deposit a variety of commercial and custom electronic materials onto low-temperature substrates without masks or other thin-film equipment. This flexible, non-contact process writes over rough, curved, or even random surface morphologies.

This embodiment starts with the circuit designers CAD file. Proprietary software algorithms are used to translate the *.dxf CAD directly to a machine tool path. The next step is the deposition process where metal or ceramic inks, particulate suspensions, or commercial pastes are aerosolized and then focused into a deposition flow stream and onto a substrate as shown in FIG. 10. FIG. 10 reveals one embodiment of a Flow Guided Deposition System, in which liquid inks and pastes are atomized to form a dense aerosol of droplets and particulates. The aerosols are entrained in a gas flow and fed into a proprietary deposition head 200. The co-flowing sheath gas creates the aerodynamic forces to focus the aerosol stream. Finally, the streams are directed through nozzle 210 onto a substrate and mesoscale devices directly written. The current line width capability is down to about 25 microns, and the thickness capability is up to 100's of microns.

Once the materials are deposited, they are usually post-treated to produce desired electrical and mechanical properties. This can be done either thermally or by a laser processing step depending upon the deposition material and substrate combination being used.

Deposition

The parameters which are controlled during deposition are: the line widths, line edge quality, stand-off height of the nozzle, and mass deposition flow rate.

Aerosolization

In generating the aerosol of the start material, colloids, precursor inks, or commercial pastes are atomized to form a dense cloud of micron-sized droplets and solid particles. One requirement of the material to be deposited is a uniform colloidal particle size distribution within the liquid suspension. Commercial pastes will generally meet this requirement satisfactorily. This most often is of concern when depositing proprietary or development materials, since the various sized particles will atomize with different efficiencies. This leads to preferential atomization and deposition of smaller particles. Settling of the deposited material can create layers of particle size distribution. On the other hand, small particles have relatively low inertial momentum. As described below, this leads to low Stokes number and poor line edge definition on the substrate. As a result of the competing effects, the preferred start materials are either uniform colloidal dispersions or pure liquids and the particle/droplet size generated by the atomizer is in the 0.5-3.0 micron size range. The output mist of the current units is of the order of one billion particles/second. This is also somewhat dependent upon the viscosity of the start material. The current mist generation system can work with materials with viscosity ranges from 1-1000 centipoise. This covers the range of many commercially available pastes, and also gives users the flexibility to work with many custom materials.

Flow-Guided Deposition

The output mist is entrained in a gas flow (aerosol stream), and is fed into the flow-guided deposition head. The mass throughput is controlled by the aerosol carrier gas flow rate. Inside the head, the mist is initially collimated by passing through a millimeter-sized orifice as shown in FIG. 11. FIG. 11 reveals a flow guide head, showing the particle stream, focusing orifice, and the sheath gas flow. The aerosol stream 300 passes through an initial orifice 310 serving as the primary focusing point. Then the sheath gas 320 is annularly fed around the aerosol stream and fed through a second orifice 330, preferably sub-millimeter sized, thus focusing the stream further.

The purpose of the sheath gas is to form a boundary layer that both focuses the particle stream and prevents the particles from depositing onto the orifice nozzle walls. This shielding effect minimizes clogging of the orifices and reduces contamination during change over to a different material. The emergent particle stream, which is now wrapped in the sheath gas, is focused to approximately 20% of the diameter of the second orifice. It has been accelerated to a velocity on the order of 100 meters/second.

As shown in FIG. 12, the particle stream diameter is a function of aerosol and sheath gas flow rates. The theoretical modeling and simulation results are provided by CFD Reseach Corporation. As shown, the beam diameter primarily depends on the sheath gas flow rate and the optimum stream diameter is approximately 5 times smaller than the nozzle orifice diameter. The stream diameter dependence on aerosol flow rate is not strong, but the mass deposition rate is proportional to this parameter.

The beam diameter, and consequently the line width on the substrate, is controlled primarily through the sheath gas flow rate. Increasing the sheath gas flow rate will tighten the deposition beam and create narrower deposition lines. This cannot be increased endlessly since the laminar flow nature of the sheath gas cannot be compromised. As a clear upper limit, the combined sheath and aerosol speed cannot exceed the speed of sound (roughly 300 meters/second).

The deposited feature size is dependent on the diameter of the deposition stream but also on the particle inertial momentum. The particle inertial momentum is conveniently described by the Stokes number:

$$Stk = \frac{\rho_p C_c d_p^2 U}{9\eta W}$$

where:

$\rho_p$=particle density $C_c$=slip correction factor $d_p$=particle diameter

U=average gas velocity at the nozzle exi $\eta$=gas viscosity

W=nozzle diameter

Simulations show that particles with high Stokes numbers (>1) tend to maintain a straight line trajectory from the nozzle to the substrate. Particles with low Stokes number predominately follow the gas stream lines. Instead of impacting on the substrate the low Stokes number particles follow the shear flow tangent to the substrate. Under typical conditions nearly all particles 1.0 micron and larger deposit on the substrate, but smaller particles do not. For this reason, the particle generator must produce droplet sizes of order one micron range.

One other factor to attaining good edge definition and minimum line width is the viscosity of deposited material. As in screen printing, the best edge definition and line shape is obtained with high viscosity materials. During the deposition process, the droplets can be partially dried by the sheath gas. This occurs because the sheath gas initially contains negligible amounts of solvent. As the droplets dry the solvent diffuses across the boundary layer between sheath and aerosol streams. During deposition the solvent is swept away in the sheath stream but the dried particles are deposited on the substrate. Passing aerosol stream through a heated tube before feeding it into the deposition head can also facilitate droplet drying. The net effect is to form more viscous, dried materials that do not flow when deposited.

An example of the line definition and feature size achievable using the present invention is shown in FIG. 13, which reveals 35 micron silver lines on a 60 micron pitch deposited on Kapton™. The silver start material is metal organic ink that was atomized, deposited, and finally treated on a hot plate at 200 degrees C. The measured inductance is 3 micro henries. The overall diameter of the coil is 2.0 mm. The start material is silver ink that was deposited and then treated on a 200 degrees C. hot plate to chemically decompose the precursors and densify the silver. In depositing this pattern, the substrate was translated beneath the deposition head at a speed of 10 mm/s. Because the particle velocities approach 100 m/s, the substrate translation speeds can be very high. This embodiment deposits material at 0.5 m/s. Greater speeds should be possible with custom translation stages.

As a result of the collimation and high velocity, the small beam diameter is maintained without significant divergence over several millimeters from the orifice. The maximum stand off height of the nozzle to the substrate is controlled by the total gas flow rate (sheath plus aerosol). Higher flow rates increase the particle velocity and Stokes number, consequently higher stand off heights are possible. The large stand off height makes it possible to write over surfaces with significant morphological texturing.

As an example of this, FIGS. 14, 15 and 16 show a three-dimensional ferrite-core inductor that has been built using the present invention. A three-step process used to fabricate a ferrite-core inductor on a Kapton™. Step one is to deposit parallel lines of silver directly onto the Kapton™. Step two is to deposit ferrite and glass powder over the conductors and to densify the powder with a laser. The blue color of the ferrite in the second image is an artifact of the lighting required to bring the image in focus. The final step is to deposit diagonal silver lines over the core, connecting the parallel lines of layer one, to create the coil.

The inductor is build by first depositing parallel lines of silver ink on Alumina. The lines are approximately 100 microns wide, 1 micron thick and 1000 microns in length. The lines are laser treated to form dense, conductive silver wires. These wires are one-half of the conductive traces that will eventually wrap around a ferrite core. Silver contact pads (1000 micron square) are also added in the first layer.

The second step is to deposit a mixture of Manganese-Zinc Ferrite powder and low melting temperature glass over the conductive lines. The powder is densified by scanning a laser across the deposit, which melts the glass. The glass flows around the ferrite particles and forms a dense, connected solid after cooling. The ferrite deposition step is repeated several times to buildup the deposit to about 100 microns. The ferrite line lengths are about 1500 mm long.

The final step is to write conductive traces over the ferrite layer and connect them to the underlying traces. Since the deposition head standoff distance is several mm, it is relatively simple to write over a mm-sized curved surface. The resistance of a typical coil generated using this method is on the order of several ohms. The inductance is 7 micro henries and the Q value is 4.2 @ 1 MHz.

FIG. 17 portrays the typical profile of the deposited ferrite layer. While high gas flow rates have beneficial effects to focusing the particle stream and accelerating the particle to high Stokes number, there are situations where this will not produce the optimal result. When the gas stream impacts on the substrate it creates a significant lateral flow. The lateral flow can cause the particles to be swept away from the substrate feature rather than deposited. This occurs mainly on non-planar substrates when depositing near vertical (or nearly vertical) structures such as channels. When the gas stream hits the vertical wall an asymmetrical lateral flow is established. This flow field carries the particles away from the wall and causes them to deposit some distance away. The solution in practice is to tilt the deposition head relative to the side-wall by at least 20 degrees. In this case contiguous deposition can be achieved over step heights of at least 200 microns.

The present invention comprises a maskless deposition process that fills a niche in the mesoscale regime between thick and thin film. The invention is capable of depositing multiple materials into fine geometries on both planar and curved substrates. The materials can be either commercial pastes or custom, low-fire inks. Laser processing allows the materials to be densified on low-temperature polymers.

The present invention may be applied to a wide range of applications. The ability to deposit fine lines over curved and stepped surface suggests applications in writing interconnect wires between IC chips and PWB. The ability to deposit multiple materials lends to applications in multilayer components as well as to encapsulating components once they are built. The ability to fire materials on low-temperature substrate allows discrete components to be directly written on polymers. These features add up to a tremendous new capability and resource for electronics manufacturers.

CONCLUSION

Although the present invention has been described in detail with reference to particular preferred and alternative embodiments, persons possessing ordinary skill in the art to which this invention pertains will appreciate that various modifications and enhancements may be made without departing from the spirit and scope of the Claims that follow. The various configurations that have been disclosed above are intended to educate the reader about preferred and alternative embodiments, and are not intended to constrain the limits of the invention or the scope of the Claims. The List of Reference Characters which follows is intended to provide the reader with a convenient means of identifying elements of the invention in the Specification and Drawings. This list is not intended to delineate or narrow the scope of the Claims.

What is claimed is:

1. An apparatus comprising:

a material source for supplying a material to be deposited;

a generator for producing a plurality of discrete particles from said material source;

a carrier gas for propelling said plurality of discrete particles generally toward a substrate;

a coflowing sheath gas which surrounds said carrier gas for focusing said plurality of discrete particles;

no more than one orifice for narrowing a particle stream comprising said coflowing sheath gas, said carrier gas, and said plurality of discrete particles sufficiently to form a deposited feature comprising a feature size of less than one millimeter on the substrate; and a system for moving the substrate and/or said orifice relative to each other.

2. The apparatus of claim 1 additionally comprising a sorter for sorting said plurality of discrete particles by size.

3. The apparatus of claim 1 wherein said coflowing sheath gas forms a boundary layer that prevents said plurality of discrete particles from depositing onto walls of an orifice nozzle.

4. The apparatus of claim 1 further comprising a virtual impactor.

5. The apparatus of claim 4 wherein said virtual impactor is placed after said atomizer.

6. The apparatus of claim 5 wherein said virtual impactor extracts excess carrier gas without substantially reducing the number of said plurality of discrete particles.

7. The apparatus of claim 5 wherein said virtual impactor sorts said plurality of discrete particles by size.

8. The apparatus of claim 5 further comprising two or more virtual impactors placed in series.

9. The apparatus of claim 1 further comprising a laser for processing said plurality of discrete particles.

10. The apparatus of claim 1 further comprising a computer for storing a Computer Aided Design (CAD) file.

11. The apparatus of claim 10 wherein said system is operated according to said CAD file.

12. The apparatus of claim 1 wherein said plurality of discrete particles comprise liquid droplets.

13. The apparatus of claim 12 wherein said plurality of discrete particles comprises a mist.

14. The apparatus of claim 12 further comprising a heated tube for drying said liquid droplets.

15. The apparatus of claim 1 wherein a size of said particle stream is approximately 20% of a size of said orifice.

16. The apparatus of claim 1 wherein the substrate is non-planar.

17. The apparatus of claim 16 wherein the substrate is three dimensional.

18. The apparatus of claim 17 further comprising a system for tilting said orifice and/or the substrate with respect to each other.

* * * * *